(12) United States Patent
Arai

(10) Patent No.: US 9,711,576 B2
(45) Date of Patent: Jul. 18, 2017

(54) DISPLAY, METHOD OF MANUFACTURING DISPLAY AND ELECTRONIC DEVICE

(75) Inventor: Toshiaki Arai, Kanagawa (JP)

(73) Assignee: Joled Inc., Tokyo (JP)

( * ) Notice: Subject to any disclaimer, the term of this patent is extended or adjusted under 35 U.S.C. 154(b) by 480 days.

(21) Appl. No.: 12/941,449

(22) Filed: Nov. 8, 2010

(65) Prior Publication Data

US 2011/0133666 A1   Jun. 9, 2011

(30) Foreign Application Priority Data

Dec. 3, 2009   (JP) ................ P2009-275487
Jul. 21, 2010   (JP) ................ P2010-163829

(51) Int. Cl.
*H01L 27/32* (2006.01)
*H01L 27/12* (2006.01)
*H01L 51/52* (2006.01)

(52) U.S. Cl.
CPC ...... *H01L 27/3248* (2013.01); *H01L 27/1214* (2013.01); *H01L 51/5218* (2013.01)

(58) Field of Classification Search
CPC .......................... H01L 27/3248; H01L 27/124
USPC ........................................................ 257/88
See application file for complete search history.

(56) References Cited

U.S. PATENT DOCUMENTS

| 7,511,309 B2 * | 3/2009 | Shin .............................. 257/83 |
| 2006/0027804 A1 * | 2/2006 | Yamazaki ............. G02F 1/1368 257/59 |
| 2006/0273715 A1 * | 12/2006 | Yang ................... H01L 27/3248 313/504 |
| 2007/0093005 A1 * | 4/2007 | Kim et al. .................... 438/149 |
| 2008/0042550 A1 * | 2/2008 | Matsuura et al. ............ 313/498 |
| 2012/0074414 A1 * | 3/2012 | Lee ....................... H01L 27/124 257/59 |

FOREIGN PATENT DOCUMENTS

| JP | 2001-195008 | 7/2001 |
| JP | 2001-291595 | 10/2001 |
| JP | 2001-295008 | 10/2001 |
| JP | 2004-006327 | 1/2004 |
| JP | 2004-214010 | 7/2004 |
| JP | 2005-243280 | 9/2005 |
| JP | 2006-310317 | 11/2006 |
| JP | 2007-005807 | 1/2007 |
| JP | 2008-015293 | 1/2008 |
| JP | 2009-224118 | 10/2009 |
| WO | 2004/060022 | 7/2004 |

OTHER PUBLICATIONS

Japanese Office Action issued Feb. 12, 2014 in corresponding Japanese Patent Application No. 2010163829.
Japanese Office Action issued Oct. 2, 2014 in corresponding Japanese Application No. 2010-163829.

* cited by examiner

*Primary Examiner* — Nimeshkumar Patel
*Assistant Examiner* — Christopher Raabe
(74) *Attorney, Agent, or Firm* — K&L Gates LLP

(57) ABSTRACT

A display including a light-emitting element is provided. The light-emitting element includes a lower display electrode, an organic layer including a light-emitting layer, and an upper display electrode, wherein the lower display electrode is formed in a source-drain electrode layer or a gate electrode layer. A method of manufacture and an electronic device including the display are also provided.

14 Claims, 32 Drawing Sheets

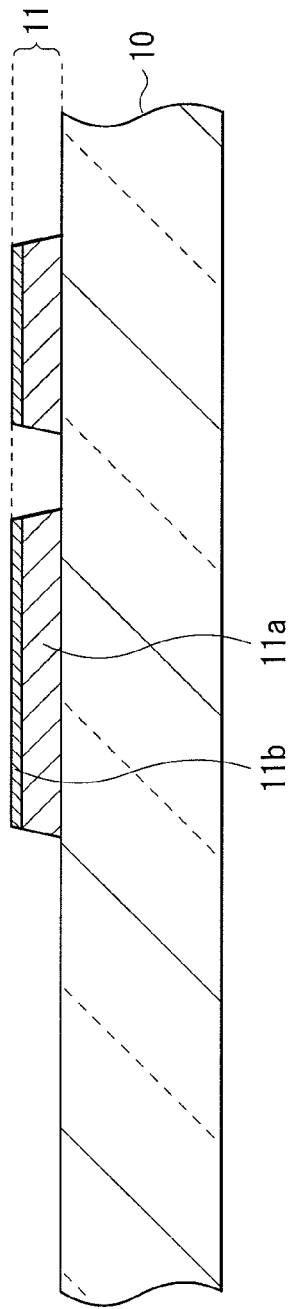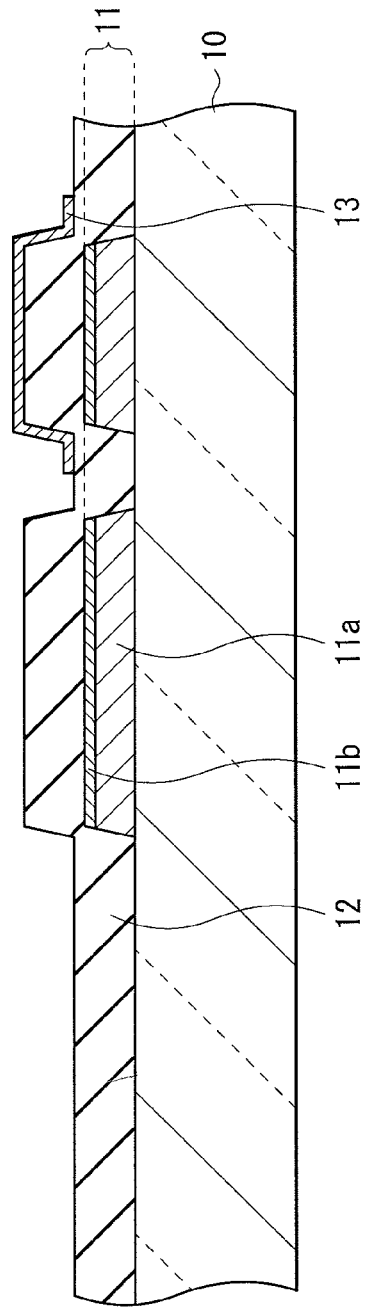

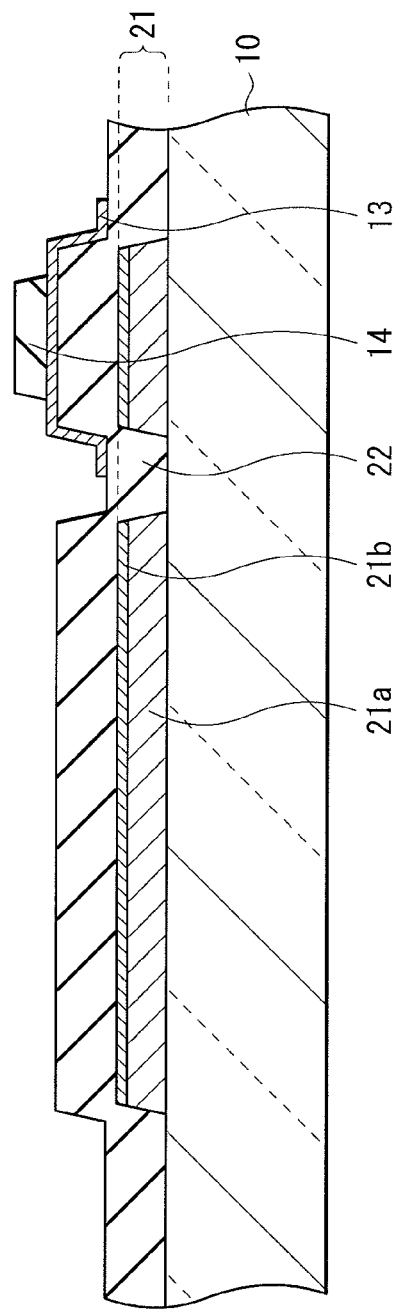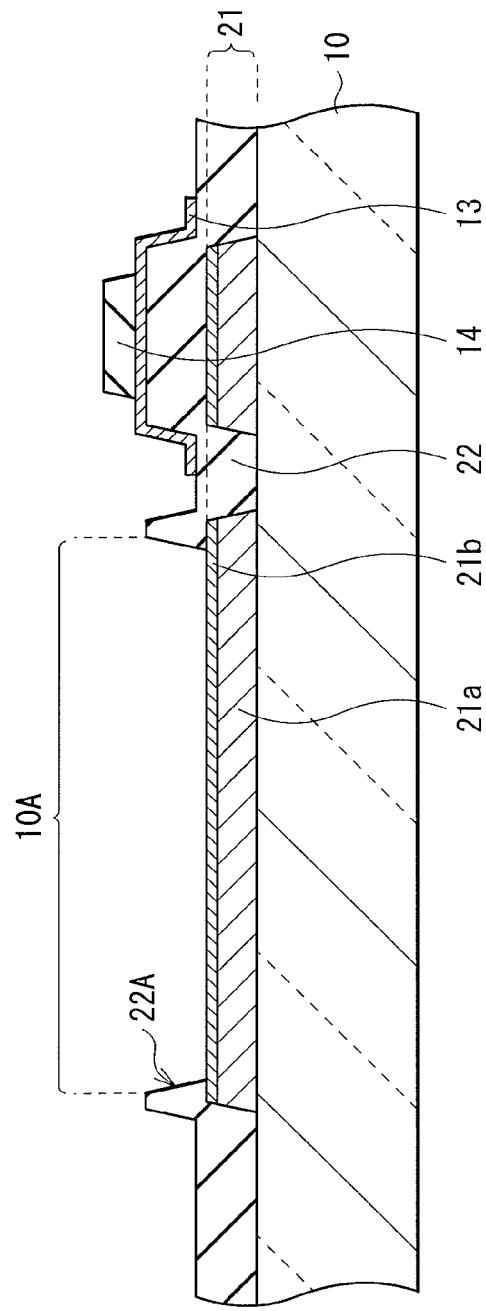

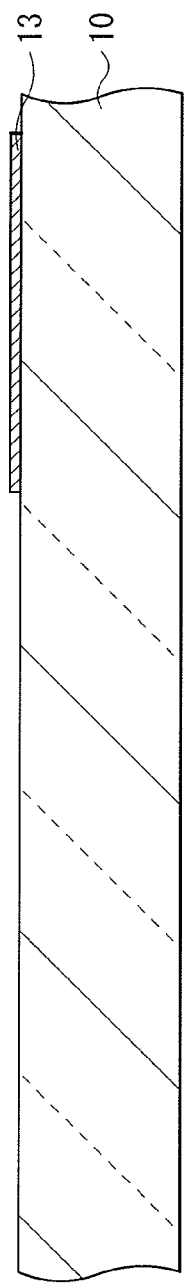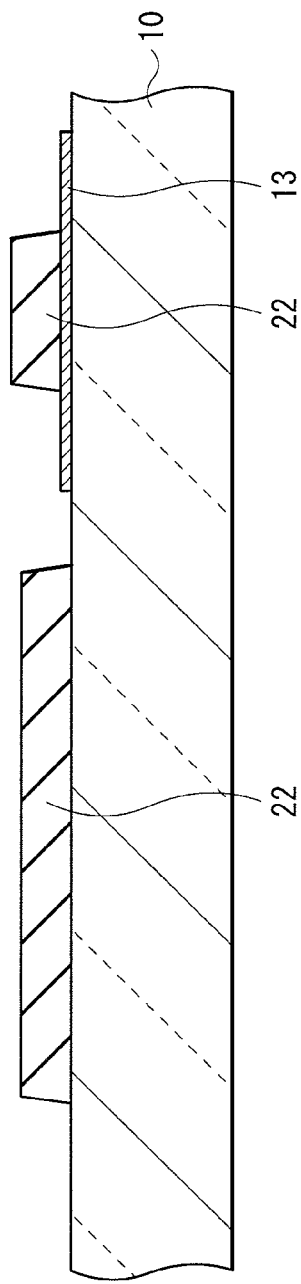
FIG. 22A
FIG. 22B

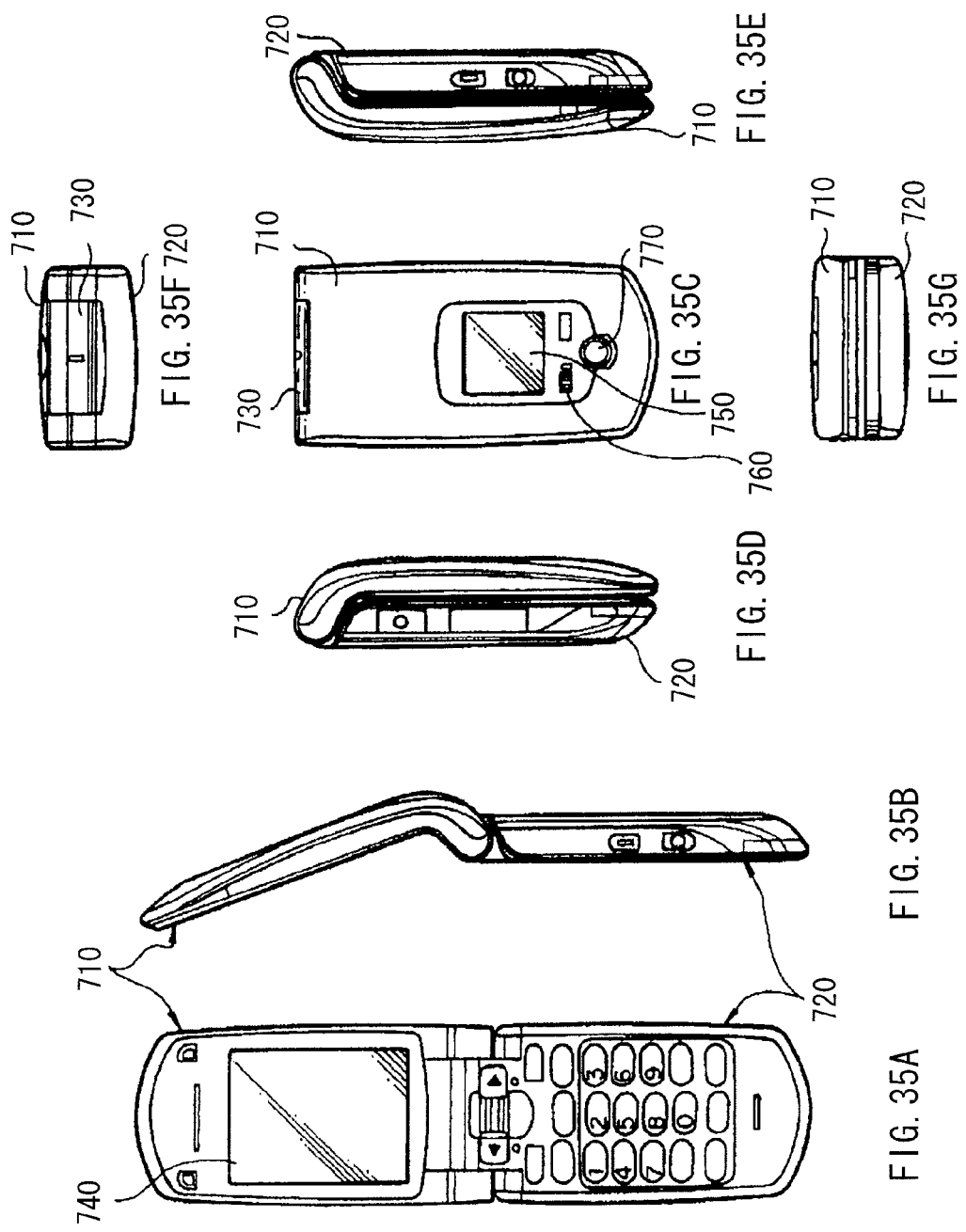

DISPLAY, METHOD OF MANUFACTURING DISPLAY AND ELECTRONIC DEVICE

CROSS REFERENCES TO RELATED APPLICATIONS

The present application claims priority to Japanese Priority Patent Application Nos. JP 2009-275487 and JP 2010-163829 filed in the Japan Patent Office on Dec. 3, 2009 and Jul. 21, 2010, the entire contents of which is hereby incorporated by references.

BACKGROUND

The present application relates to a display performing a display drive with use of a TFT (Thin Film Transistor), and a method of manufacturing the display, and an electronic device.

In recent years, in the field of displays, next-generation displays have been actively developed, and a display with a smaller size, higher luminance, lower power consumption or the like is desired. As such a display, attention is given to an organic EL display using an organic EL (Electro Luminescence) element. The organic EL display is of a self-luminous type, so the organic EL display has a wide viewing angle and does not need a backlight. Therefore, a reduction in power consumption is expected. Moreover, the organic EL display has advantages that responsivity is high and a reduction in the thickness of the display is allowed. Further, an organic light-emitting material has flexibility, so a display having flexibility is allowed to be formed with use of, as a substrate, a flexible substrate made of plastic or the like.

Herein, as a drive system of the organic EL display, an active matrix drive system using TFTs as drive elements is used. The active matrix system is more advantageous in response time or resolution than a passive matrix system, and the active matrix system is considered as a specifically suitable drive system for the organic EL display having the above-described characteristics.

Such an active matrix organic EL display includes a drive substrate in which an organic EL element including an organic light-emitting material and a drive element (TFT) for driving the organic EL element are arranged. Then, a sealing substrate is bonded onto the drive substrate so that the organic EL element is sandwiched between the drive substrate and the sealing substrate.

Moreover, there are a bottom emission system organic EL display in which light from the organic EL element is emitted to the above-described drive substrate and a top emission system organic EL display in which light from the organic EL element is emitted to the above-described sealing substrate. In the top emission system organic EL display, a drive circuit including a TFT is allowed to formed below a display electrode, so the top emission system organic EL display has been developed mainly, for example, as described in Japanese Unexamined Patent Application Publication Nos. 2001-195008 and 2001-291595, because it is necessary to form a complicated correction circuit or the like performing correction for allowing a uniform current to flow through each pixel in the drive substrate, and in the top emission system, such a correction circuit is allowed to be arranged in a small area below the display electrode, so a decline in aperture ratio is preventable. Further, as an anode electrode of the organic EL element, a transparent conductive film is often used, for example, as described in Japanese Unexamined Patent Application Publication No. 2006-310317.

SUMMARY

However, in recent years, the above-described correction circuit is being simplified according to upsizing of a pixel with upsizing of a display, or an improvement in characteristic uniformity of drive transistors. Therefore, even in the top emission system, a necessity to arrange a circuit in a small area below the display electrode is reduced, and an influence on aperture ratio is reduced.

On the other hand, in the top emission system, first, a drive circuit including a TFT is formed on a substrate, and then an organic EL element is formed on the drive circuit with a planarization film in between. More specifically, first, a gate electrode, a gate insulating film, a semiconductor layer and a source-drain electrode layer are formed in order on the substrate to form the TFT, and then the planarization film is formed on the TFT, and after that, a lower display electrode (an anode), an inter-pixel insulating film, a light-emitting layer, an upper display electrode (a cathode) and the like are formed in order to form the organic EL element. As a film formation process of the TFT except for the above-described process, first, a semiconductor layer is formed on a substrate, and then a gate insulating film, a gate electrode and a source-drain electrode are formed in order. As a result, manufacturing steps or constituent materials are increased, and a disadvantage in cost arises. Therefore, it is desired to achieve a display of which manufacturing steps are allowed to be simplified.

In an embodiment, a light-emitting element including a lower electrode, an organic layer including a light-emitting layer, and an upper electrode wherein the lower electrode is formed in a source-drain electrode layer or a gate electrode layer.

In an embodiment, a display including a light-emitting element arranged on a substrate, the light-emitting element including a lower display electrode, an organic layer including a light-emitting layer, and an upper display electrode wherein the lower display electrode is formed in a source-drain electrode layer or a gate electrode layer.

In an embodiment, a display element including: a light-emitting element arranged on a substrate and including a lower display electrode, an organic layer including a light-emitting layer, and an upper display electrode; and a drive element arranged on the substrate and including a gate electrode layer and a source-drain electrode layer, wherein the gate electrode layer or the source-drain electrode layer is common to the drive element and the light-emitting element, and wherein the lower display electrode of the light-emitting element is formed in the gate electrode layer or the source-drain electrode layer.

In an embodiment, a display comprising a display element, the display element including: a light-emitting element arranged on a substrate and including a lower display electrode, an organic layer including a light-emitting layer, and an upper display electrode; and a drive element arranged on the substrate and including a gate electrode layer and a source-drain electrode layer, wherein the gate electrode layer or the source-drain electrode layer is common to the drive element and the light-emitting element, and wherein the lower display electrode of the light-emitting element is formed in the gate electrode layer or the source-drain electrode layer.

In an embodiment, a method of manufacturing a display element including: forming a light-emitting element on a substrate, the light-emitting element including a lower display electrode, an organic layer including a light-emitting layer, and an upper display electrode; and forming a drive element on the substrate, the drive element including a gate electrode layer and a source-drain electrode layer, wherein the gate electrode layer or the source-drain electrode layer is common to the drive element and the light-emitting element, and wherein the lower display electrode of the light-emitting element is formed in the gate electrode layer or the source-drain electrode layer.

In an embodiment, a method of manufacturing a display including: forming a semiconductor layer on a substrate, wherein the substrate includes a first region associated with a light-emitting element forming region and a second region associated with a drive element forming region, wherein the semiconductor layer includes a channel and a gate electrode layer and is formed in the second region; forming a source-drain electrode layer including an electrode layer in the first region and the second region after forming the semiconductor layer and the gate electrode layer; forming an inter-pixel insulating film having an opening in the first region on the source-drain electrode layer; selectively removing a portion of the source-drain electrode layer in the first region after forming the inter-pixel insulating film; and forming an organic layer including a light-emitting layer, and an upper display electrode on the electrode layer exposed in the first region after removing the portion of the source-drain electrode layer.

In an embodiment, a method of manufacturing a display including: forming a semiconductor layer on a substrate, wherein the substrate includes a first region associated with a light-emitting element forming region and a second region associated with a drive element forming region, wherein the semiconductor layer includes a channel and a gate electrode layer and is formed in the second region; forming a gate electrode layer including an electrode layer in the first region and the second region; forming a source-drain electrode layer after forming the semiconductor layer and the gate electrode layer; forming an inter-pixel insulating film having an opening in the first region on the substrate after forming the source-drain electrode layer; selectively removing a portion of the gate electrode layer in the first region after forming the inter-pixel insulating film; and forming an organic layer including a light-emitting layer and an upper display electrode on the electrode layer exposed in the first region after removing the portion of the gate electrode layer.

In the first method of manufacturing a display according to the embodiment, the source-drain electrode layer in which the upper metal layer is laminated on the top surface of the electrode layer is formed over the first and second regions, so when the inter-pixel insulating film is formed, the upper metal layer functions as a protective film so that damage to the electrode layer is preventable. After that, a part corresponding to the first region of the upper metal layer is selectively removed to expose a surface of the electrode layer, so the source-drain electrode layer (the electrode layer) of the drive element is allowed to function as a lower display electrode of the light-emitting element in the first region. Thus, after forming the drive element, a step of forming a planarization film is not necessary, and it is not necessary to form a lower display electrode of the light-emitting element separately. Therefore, steps of manufacturing a display are allowed to be simplified.

In the second method of manufacturing a display according to the embodiment, the gate electrode layer in which the upper metal layer is formed on the top surface of the electrode layer is formed in the first and second regions, so when the inter-pixel insulating film is formed, the upper metal layer functions as a protective film so that damage to the electrode layer is preventable. After that, a part corresponding to the first region of the upper metal layer is selectively removed to expose a surface of the electrode layer, so the gate electrode layer (the electrode layer) of the drive element is allowed to function as a lower display element of the light-emitting element in the first region. Thus, after the drive element is formed, a step of forming a planarization film is not necessary, and it is not necessary to form a lower display electrode of the light-emitting element separately. Therefore, steps of manufacturing a display are allowed to be simplified.

In the display and the electronic device according to the embodiment, the gate electrode layer or the source-drain electrode layer of the drive element is arranged in the first and second regions, and includes the electrode layer and the upper metal layer laminated on the top surface of the electrode layer. In the first region where the light-emitting element is arranged, the upper metal layer is removed, so the electrode layer is allowed to function as a lower display electrode. The number of manufacturing steps or the number of constituent materials is allowed to be reduced, so a reduction in cost is achievable.

Other and further objects, features and advantages of the application will appear more fully from the following description.

Additional features and advantages are described herein, and will be apparent from the following Detailed Description and the figures.

BRIEF DESCRIPTION OF THE FIGURES

FIGS. 2A and 2B are diagrams illustrating steps of a method of manufacturing the display illustrated in FIG. 1.

FIGS. 15A and 15B are diagrams illustrating steps following the step in FIG. 14.

FIGS. 22A and 22B are diagrams illustrating steps of a method of manufacturing the display illustrated in FIG. 21.

FIGS. 35A to 35G illustrate Application Example 5, FIGS. 35A and 35B are a front view and a side view in a state in which Application Example 5 is opened, respectively, and FIGS. 35C, 35D, 35E, 35F and 35G are a front view, a left side view, a right side view, a top view and a bottom view in a state in which Application Example 5 is closed, respectively.

DETAILED DESCRIPTION

Embodiments of the present application will be described in detail hereinbelow with reference to the drawings.

1. First Embodiment (Example in which a source-drain electrode layer also serves as an anode electrode)

2. Second Embodiment (Example in which a gate electrode layer also serves as an anode electrode)

3. Third Embodiment (Another example in which a gate electrode layer also serves as an anode electrode)

4. Application Examples (Examples of electronic device)

First Embodiment

Configuration of Display 1

Figure 1:
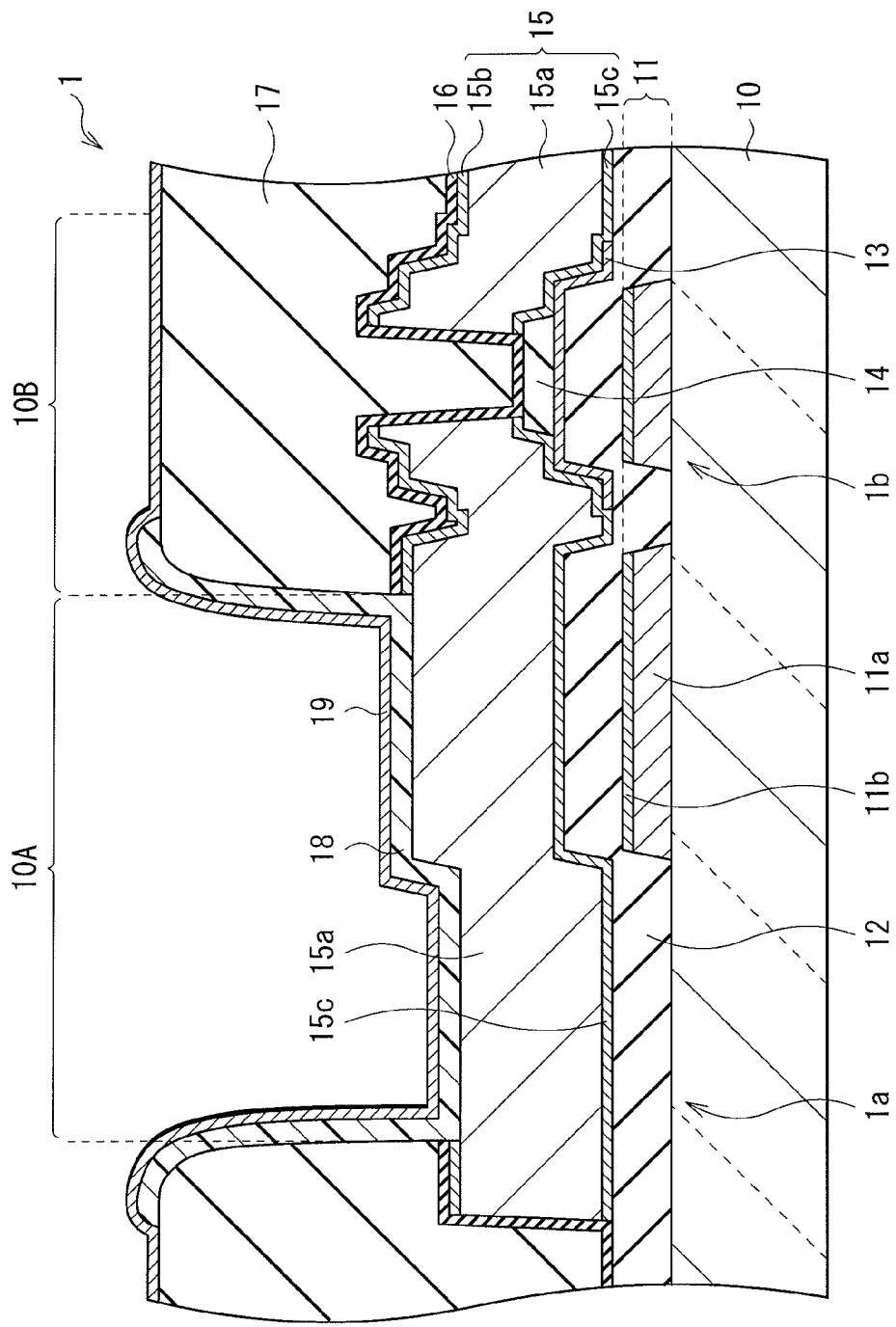
FIG. 1 is a sectional view of a display according to a first embodiment.

FIG. 1 illustrates a sectional configuration of a display 1 according to a first embodiment. The display 1 is, for example, an active matrix organic EL display, and includes a plurality of pixels arranged in a matrix form. Each of the pixels includes an organic EL element 1a in a region 10A (a first region) and a TFT 1b in a region 10B (a second region) on a substrate 10. In the embodiment, a source-drain electrode layer 15 in the TFT 1b also functions as an anode electrode of the organic EL element 1a.

TFT 1b

The TFT 1b is a so-called bottom gate type (an inverted stagger configuration) TFT, and in the TFT 1b, a gate electrode layer 11, a gate insulating film 12, a semiconductor layer 13, a channel protective film 14 and the source-drain electrode layer 15, and a protective film 16 are formed in order on the substrate 10.

The gate electrode layer 11 controls carrier density (in this case, electron density) in the semiconductor layer 13 by a gate voltage applied to the display 1. However, the gate electrode layer 11 includes not only a gate electrode in the TFT 1b but also another electrode arranged in the same layer as a layer where the gate electrode is arranged and formed with the same laminate film configuration as that of the gate electrode, for example, a lower electrode or the like of a capacitor. The gate electrode layer 11 is connected to the source-drain electrode layer 15 through a contact hole (not illustrated).

The gate electrode layer 11 has a multilayer film configuration in which a plurality of metal films including an electrode layer 11a are laminated, for example, a two-layer configuration including an upper metal layer 11b on a top surface of the electrode layer 11a. The electrode layer 11a is made of a low-resistance metal material, for example, a simple substance of aluminum (Al), silver (Ag) or copper (Cu), an aluminum alloy, a silver alloy, a copper alloy, or a laminate film thereof, and has a thickness of, for example, 100 nm to 500 nm. As the aluminum alloy, an alloy (an AlNd alloy) of aluminum and neodymium (Nd) is used. The upper metal layer 11b includes, for example, molybdenum (Mo) or titanium (Ti), and has a thickness of, for example, 10 nm to 100 nm.

In the above-described multilayer film configuration, the electrode layer 11a has a function as a gate electrode controlling carrier density and wiring supplying a potential. The upper metal layer 11b is arranged so as to protect the electrode layer 11a from heat or corrosion and to secure contact between the electrode layer 11a and the source-drain electrode layer 15 (electrical contact through a contact hole). In the embodiment, the gate electrode layer 11 may be the above-described laminate film or a single-layer film configured of only the electrode layer 11a. Moreover, it may be only necessary to arrange the gate electrode layer 11 in the region 10B.

The gate insulating film 12 is a single-layer film configured of one kind selected from the group consisting of a silicon oxide film, a silicon nitride film, a silicon oxynitride film and an aluminum oxide film and the like, or a laminate film configured of two or more kinds selected from the group.

The semiconductor layer 13 forms a channel by application of a gate voltage, and is formed with use of, for example, amorphous silicon, crystalline silicon, an oxide semiconductor or the like. Herein, an oxide semiconductor having less light leakage and allowed to maintain good TFT characteristics is used. When the oxide semiconductor is used, good characteristics are obtained without forming an $n^+$ layer between the semiconductor layer 13 and the source-drain electrode layer 15.

The channel protective film 14 is, for example, a silicon oxide film, and prevents damage to a channel during forming the source-drain electrode layer 15.

The source-drain electrode layer 15 is separated into parts in a region corresponding to a channel of the semiconductor layer 13, and one of the parts functions as a source electrode and the other functions as a drain electrode. In the embodiment, the source-drain electrode layer 15 has a multilayer film configuration in which a plurality of metal films including an electrode layer 15a are laminated, for example, a three-layer configuration including an upper metal layer 15b and a lower metal layer 15c on an top surface and a bottom surface of the electrode layer 15a, respectively. The electrode layer 15a is made of a metal having low resistance and good light reflectivity, for example, a simple substance of aluminum or silver (Ag), an aluminum alloy or a silver alloy, or a laminate film thereof, and has a thickness of, for example, 100 nm to 1000 nm. An example of the aluminum alloy is an AlNd alloy. The upper metal layer 15b and the lower metal layer 15c are made of, for example, an opaque metal material such as molybdenum (Mo) or titanium (Ti), and have a thickness of, for example, 10 nm to 100 nm. For example, in the source-drain electrode layer 15, as the electrode layer 15a, an aluminum alloy is used, and as the upper metal layer 15b and the lower metal layer 15c, molybdenum is used. The upper metal layer 15b and the lower metal layer 15c may be made of the same metal as each other or different metals from each other, and may have the same thickness as each other or different thicknesses from each other. In addition, "opaque" herein means, for example, a metal material which is not a transparent conductive film such as ITO.

In such a multilayer film configuration, the electrode layer 15a functions as the source and the drain of the TFT 1b as well as wiring supplying a potential. Herein, a low-resistance material used for the electrode layer 15a typically lacks corrosion resistance, and reacts with oxygen, water, sulfur or the like in air or a developer or a stripper used in a process to cause a decline in the functions of the electrode layer 15a. Moreover, it is known that during or after patterning, a shape defect or corrosion occurs in the electrode layer 15a due to a battery effect generated in a liquid. The upper metal layer 15b and the lower metal layer 15c have a function of preventing corrosion in such an electrode layer 15a. Further, the lower metal layer 15c also has a function of securing contact between the electrode layer 15a and a layer therebelow (in this case, the semiconductor layer 13 or the like). In the case where no influence is exerted on contact with the semiconductor layer 13 or the like or pattering of the source-drain electrode layer 15, the lower metal layer 15c may not be formed. In other words, the source-drain electrode layer 15 may have a two-layer configuration including the electrode layer 15a and the upper metal layer 15b.

In the embodiment, the source-drain electrode layer 15 is formed so as to extend not only to the region 10B where the TFT 1b is arranged but also to the region 10A where the organic EL element is arranged. More specifically, the source electrode or the drain electrode of the source-drain electrode layer 15 is formed so as to extend from the region 10B to the region 10A. Thereby, as will be described in detail later, the electrode layer 15a in the source-drain electrode layer 15 functions as an anode electrode of the organic EL element 1a (also serves as the anode electrode). Therefore, the electrode layer 15a is preferably formed of a metal material with light reflectivity of 70% or over. The above-described aluminum or silver often exhibits light reflectivity of 90% or over, and is suitable for the electrode layer 15a in the embodiment.

The protective film 16 is, for example, a single-layer film such as an aluminum oxide film, a silicon oxide film or a silicon nitride film, or a laminate film thereof. Herein, the protective film 16 is formed separately from the channel protective film 14, but the channel protective film 14 may also serve as the protective film 16, or in the case where the channel protective film 14 is a laminate film, a film in the laminate film may also serve as the protective film 14.

On the above-described TFT 1b, the inter-pixel insulating film 17 is formed on a whole surface of the substrate 10. The inter-pixel insulating film 17 has an opening in the region 10A, and the organic EL element 1a is arranged corresponding to the opening of the inter-pixel insulating film 17.

Organic EL Element 1a

The organic EL element 1a is, for example, a top emission light-emitting element in which light of one of colors R, G and B is emitted from a top surface (a surface opposite to a surface facing the substrate 10). The organic EL element 1a uses, as the anode electrode (a lower display electrode), the source-drain electrode layer 15 (more specifically, the electrode layer 15a) formed so as to extend to the region 10A, and includes an organic layer 18 including a light-emitting layer and a cathode electrode 19 (an upper display electrode) in order on the source-drain electrode layer 15.

The inter-pixel insulating film 17 is made of, for example, a photosensitive novolac-based resin material. The inter-pixel insulating film 17 is formed through performing patterning by exposing and developing the above-described resin material by a photolithography method, and then baking the resin material under an oxygen atmosphere to brown the resin material, thereby reducing transmittance on a short wavelength side. In addition to such a material, for example, in the case where light leakage of the TFT 1b is large, any other colored resin material, or an inorganic insulating material such as silicon oxide film may be used for the inter-pixel insulating film 17. However, for example, a resin material forming a rounded sectional shape is used for the inter-pixel insulating film 17 in order to secure insulation between layers of the organic EL element and prevent disconnection of a cathode electrode. Moreover, when such a rounded sectional shape is formed, patterning is often performed by two steps of exposure and development by photolithography using a photosensitive resin material.

The organic layer 18 is formed by laminating, for example, a hole injection layer, a hole transport layer, a light-emitting layer and an electron transport layer (all of which are not illustrated) in order from a side close to the substrate 10. The layers except for the light-emitting layer may be arranged as necessary. The hole injection layer is provided to enhance hole injection efficiency and to prevent leakage. The hole transport layer is provided to enhance the hole transport efficiency to the light-emitting layer. The light-emitting layer emits light by the recombination of electrons and holes in response to application of an electric field. The electron transport layer is provided to enhance electron transport efficiency to the light-emitting layer. In addition, the material of the organic layer 18 may be a typical low-molecular or high-molecular organic material and is not specifically limited.

The cathode electrode 19 is arranged as a common electrode for pixels on the substrate 10, and is made of, for example, a simple substance or an alloy of a metal element such as aluminum, magnesium (Mg), calcium (Ca), sodium (Na) or lithium (Li). Among them, an alloy of magnesium and silver (an MgAg alloy) or an alloy of aluminum and lithium (an AlLi alloy) is preferable.

Such an organic EL element 1a is covered with a protective film such as a silicon nitride film or a silicon oxide film as necessary, and a sealing substrate is bonded to the protective film with an adhesive layer in between to seal the organic EL element 1a. In the sealing substrate, a color filter and a light-shielding film or the like as a black matrix are arranged.

Method of Manufacturing Display 1

FIGS. 2A and 2B to FIG. 11 are diagrams for describing a method of manufacturing the display 1. The display 1 is manufacturable by, for example, the following steps.

First, as illustrated in FIG. 2A, the electrode layer 11a and the upper metal layer 11b are formed in order on a whole surface of the substrate 10 by, for example, a spattering method, and then patterning is performed on the electrode layer 11a and the upper metal layer 11b by, for example, a photolithography method to from the gate electrode layer 11 in a selective region.

Next, as illustrated in FIG. 2B, the gate insulating film 12 is formed on the gate electrode layer 11 by, for example, a plasma CVD (Chemical Vapor Deposition) method. At this time, in the case where a silicon nitride film is formed as the gate insulating film 12, a mixed gas including silane ($SiH_4$), ammonia ($NH_3$) and nitrogen is used as a material gas. Alternatively, in the case where a silicon oxide film is formed as the gate insulating film 12, a mixed gas including silane and dinitrogen monoxide ($N_2O$) is used.

Figure 3:
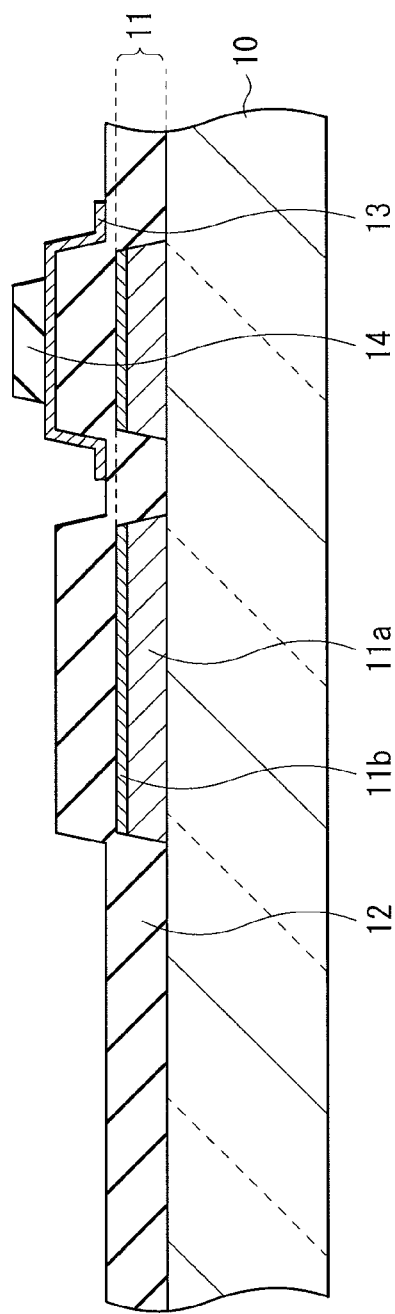
FIG. 3 is a diagram illustrating a step following the steps in FIGS. 2A and 2B.

Next, as illustrated in FIG. 3, the semiconductor layer 13 is formed by, for example, a sputtering method. More specifically, in the case where indium gallium zinc oxide (IGZO) is used as the semiconductor layer 13, DC sputtering using ceramic of IGZO as a target is performed. In this case, for example, in a DC sputtering apparatus, air in a vacuum container is exhausted until the degree of vacuum in the vacuum container reaches $1 \times 10^{-4}$ Pa or less, and then a mixed gas of argon (Ar) and oxygen is introduced into the vacuum container to perform plasma discharge. After that, the channel protective film 14 is formed on the semiconductor layer 13 by, for example, a CVD method, and the channel protective film 14 is patterned in a desired shape by, for example, a photolithography method. After patterning the channel protective film 14, a contact hole (not illustrated) for providing conduction to the gate electrode layer 11 is formed at, for example, a wiring end.

Figure 4:
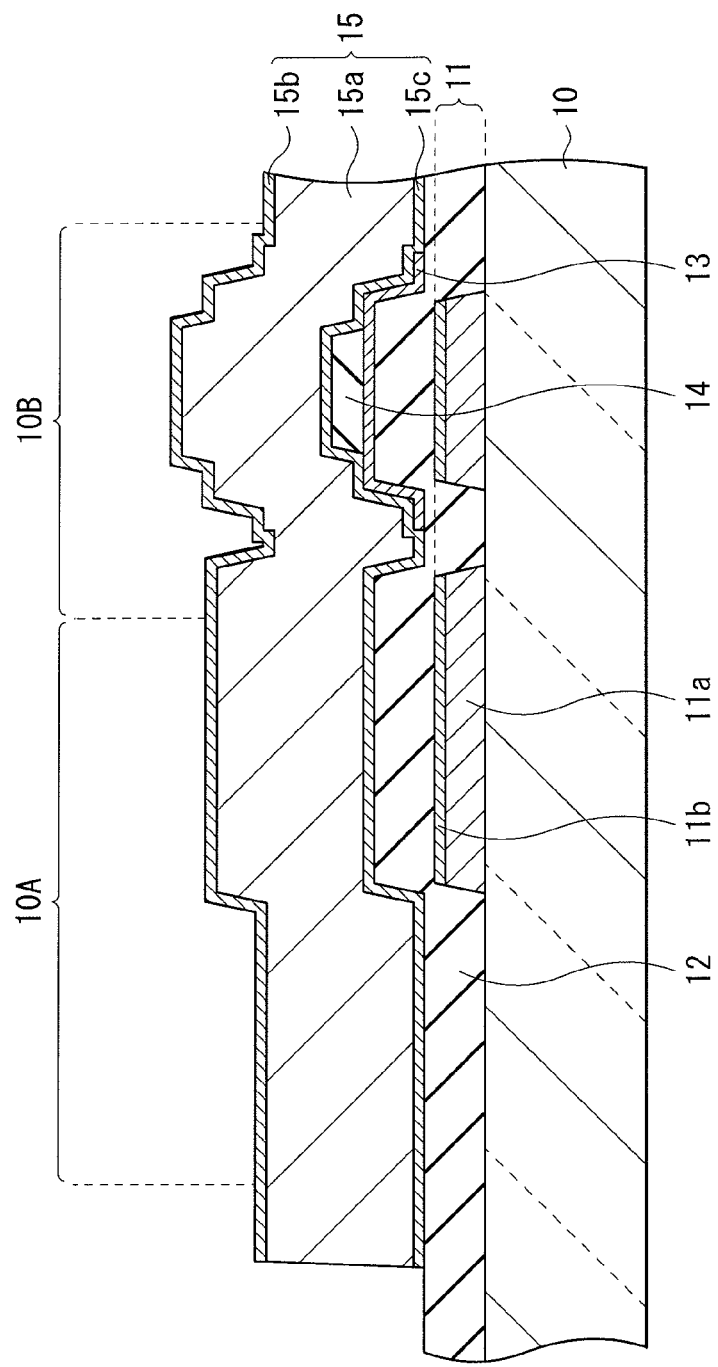
FIG. 4 is a diagram illustrating a step following the step in FIG. 3.

Next, as illustrated in FIG. 4, a metal thin film in which molybdenum, aluminum and molybdenum are laminated in this order is formed in a region including the regions 10A and 10B on the substrate 10 by, for example, a sputtering method to form the source-drain electrode layer 15.

Figure 5:
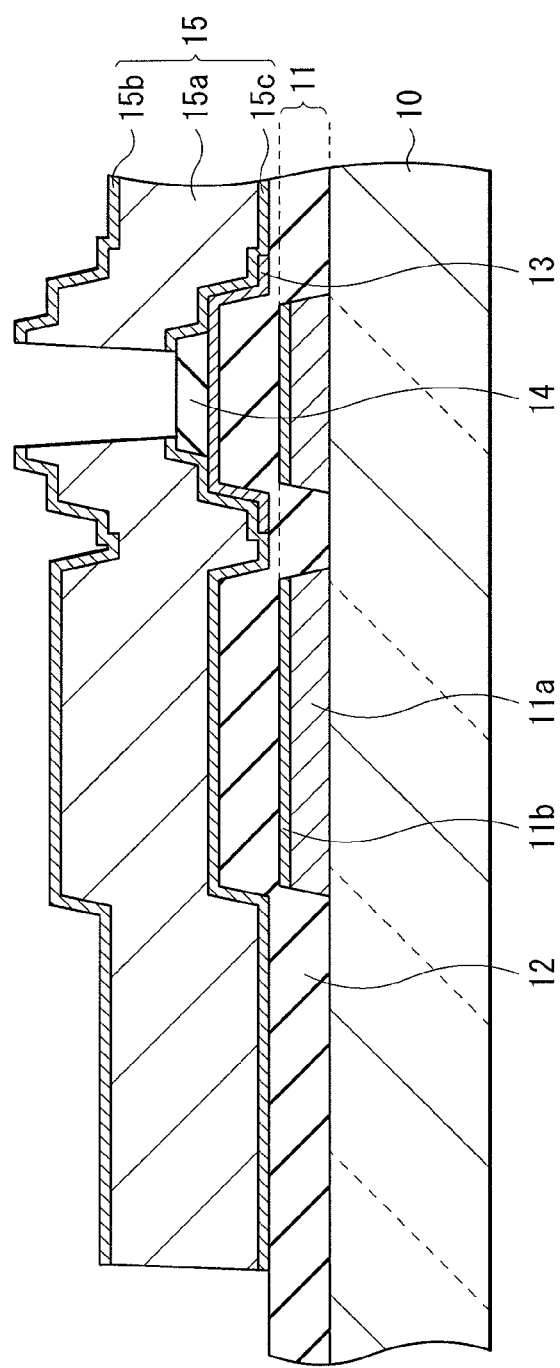
FIG. 5 is a diagram illustrating a step following the step in FIG. 4.

After that, as illustrated in FIG. 5, the source-drain electrode layer 15 is patterned by wet etching with use of, for example, a photolithography method. More specifically, a groove is formed in a region corresponding to a channel of the source-drain electrode layer 15, and the groove is formed so as to have a desired tapered shape. At this time, a surface (a channel surface) of the semiconductor layer 13 is protected by the channel protective film 14, so the semiconductor layer 13 is prevented from being damaged by etching.

Figure 6:
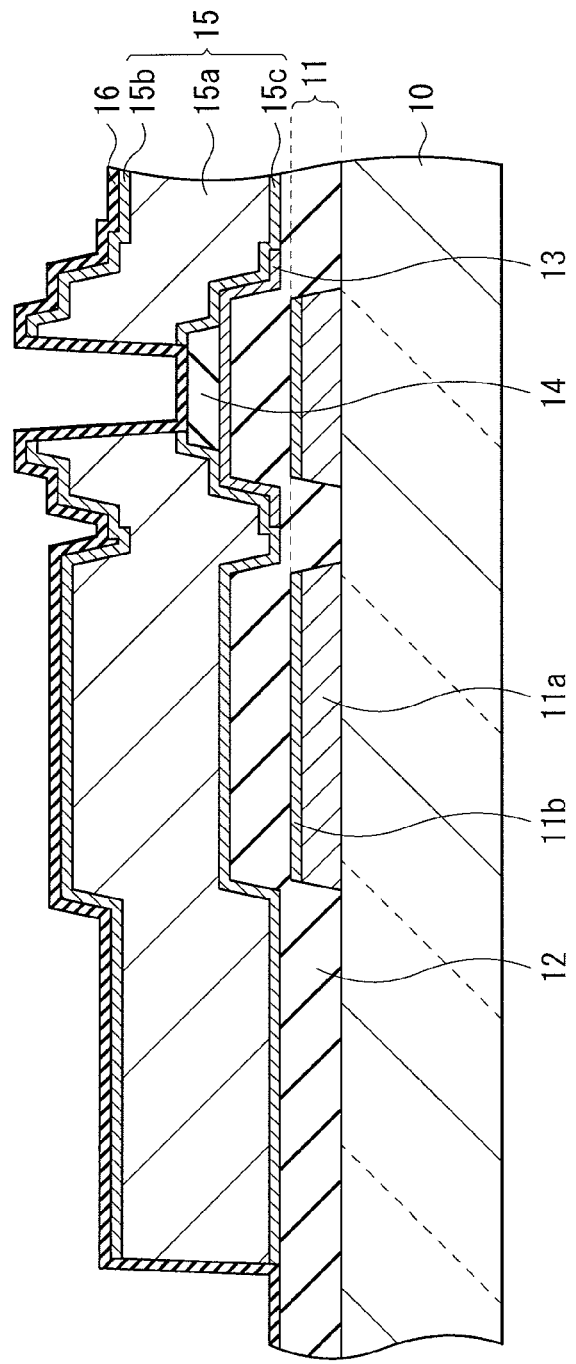
FIG. 6 is a diagram illustrating a step following the step in FIG. 5.
Figure 7:
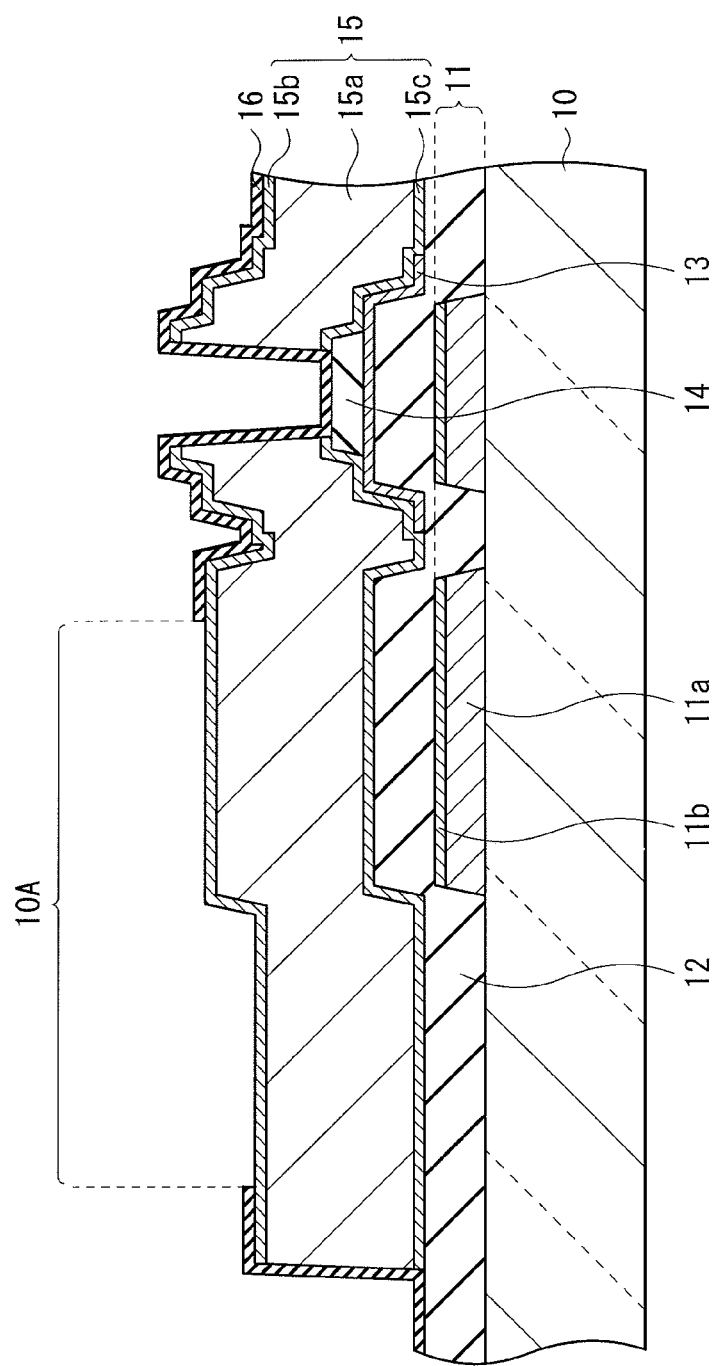
FIG. 7 is a diagram illustrating a step following the step in FIG. 6.

Next, as illustrated in FIG. 6, the protective film 16 is formed on the whole surface of the substrate 10 by, for example, a sputtering method or an atomic layer deposition (ALD) method. After that, as illustrated in FIG. 7, patterning is performed by, for example, a photolithography method to remove a part corresponding to the region 10A of the formed protective film 16.

Figure 8:
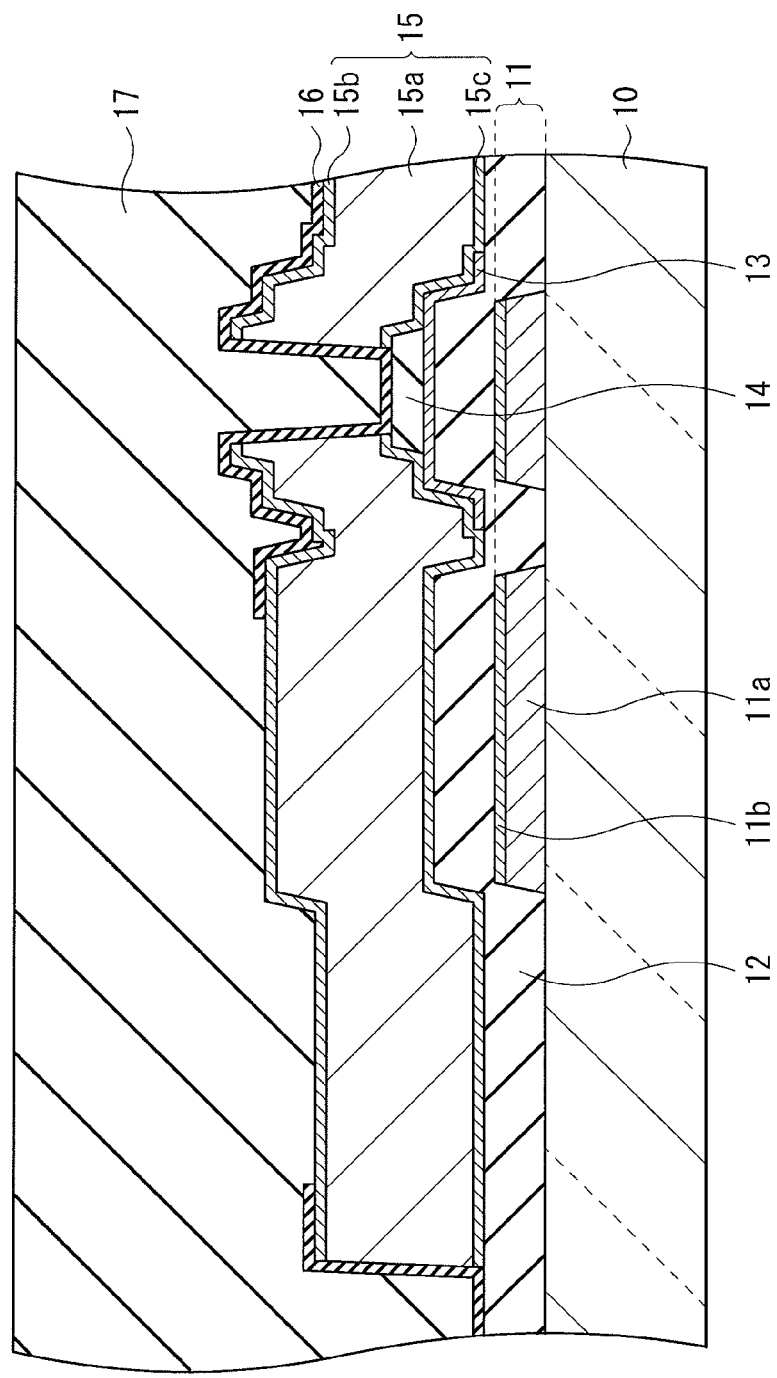
FIG. 8 is a diagram illustrating a step following the step in FIG. 7.

Then, as illustrated in FIG. 8, the inter-pixel insulating film 17 made of a photosensitive novolac-based resin material is formed on the whole surface of the substrate 10 by, for example, a coating method. At this time, for example, the formed inter-pixel insulating film 17 is browned by being baked under an atmosphere including oxygen so as to reduce transmittance on a short wavelength side.

Figure 9:
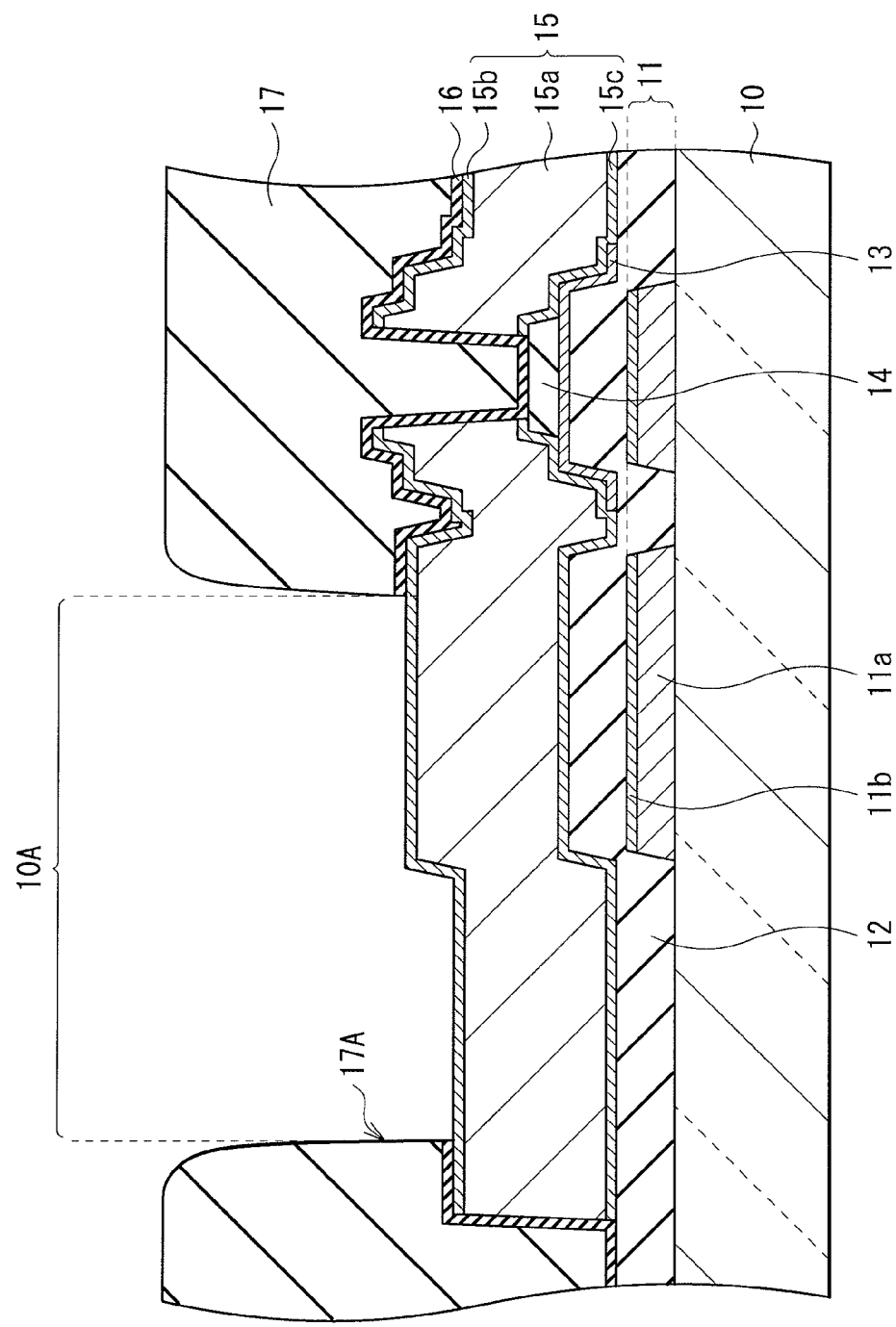
FIG. 9 is a diagram illustrating a step following the step in FIG. 8.

After that, as illustrated in FIG. 9, the formed inter-pixel insulating film 17 is patterned by, for example, a photolithography method to form an opening 17A in the region 10A. At this time, an alkaline developer is used, but such a developer has, for example, a property of dissolving metal such as aluminum. Therefore, if the electrode layer 15a in the source-drain electrode layer 15 below the inter-pixel insulating film 17 is a single-layer film, that is, in the case where the electrode layer 15a is not coated with the upper metal layer 15b, a surface of the electrode layer 15a is etched together with the inter-pixel insulating film 17 to form an uneven surface (lose flatness). In the embodiment, as described above, the source-drain electrode layer 15 has a multilayer film configuration in which the upper metal layer 15b made of molybdenum or the like is laminated on the top surface of the electrode layer 15a, so the upper metal layer 15b functions as a protective film so that damage to the electrode layer 15a is preventable.

Figure 10:
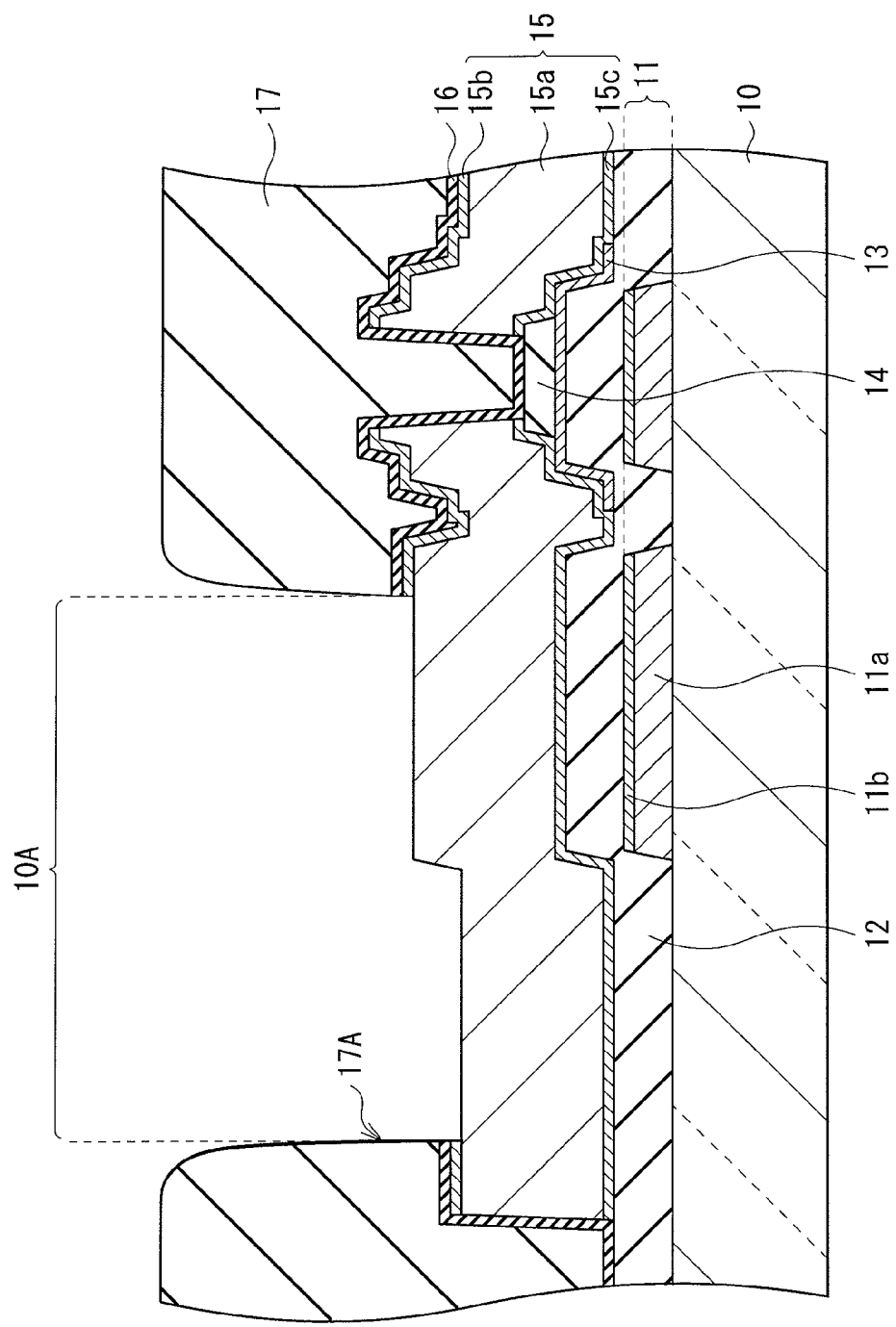
FIG. 10 is a diagram illustrating a step following the step in FIG. 9.

Next, as illustrated in FIG. 10, only a part corresponding to the region 10A of the upper metal layer 15b in the source-drain electrode layer 15 is selectively removed. At this time, etching is performed with use of, as a mask, the inter-pixel insulating film 17 having the opening 17A in the region 10A. For example, in the case where the upper metal layer 15b and the electrode layer 15a are made of molybdenum and aluminum, respectively, only the upper metal layer 15b made of molybdenum is allowed to be selectively etched with use of a mixed solution of phosphoric acid/nitric acid/acetic acid with a phosphoric acid concentration of 5% or less. Thereby, in the region 10A, the electrode layer 15a having good light reflectivity is exposed.

Figure 11:
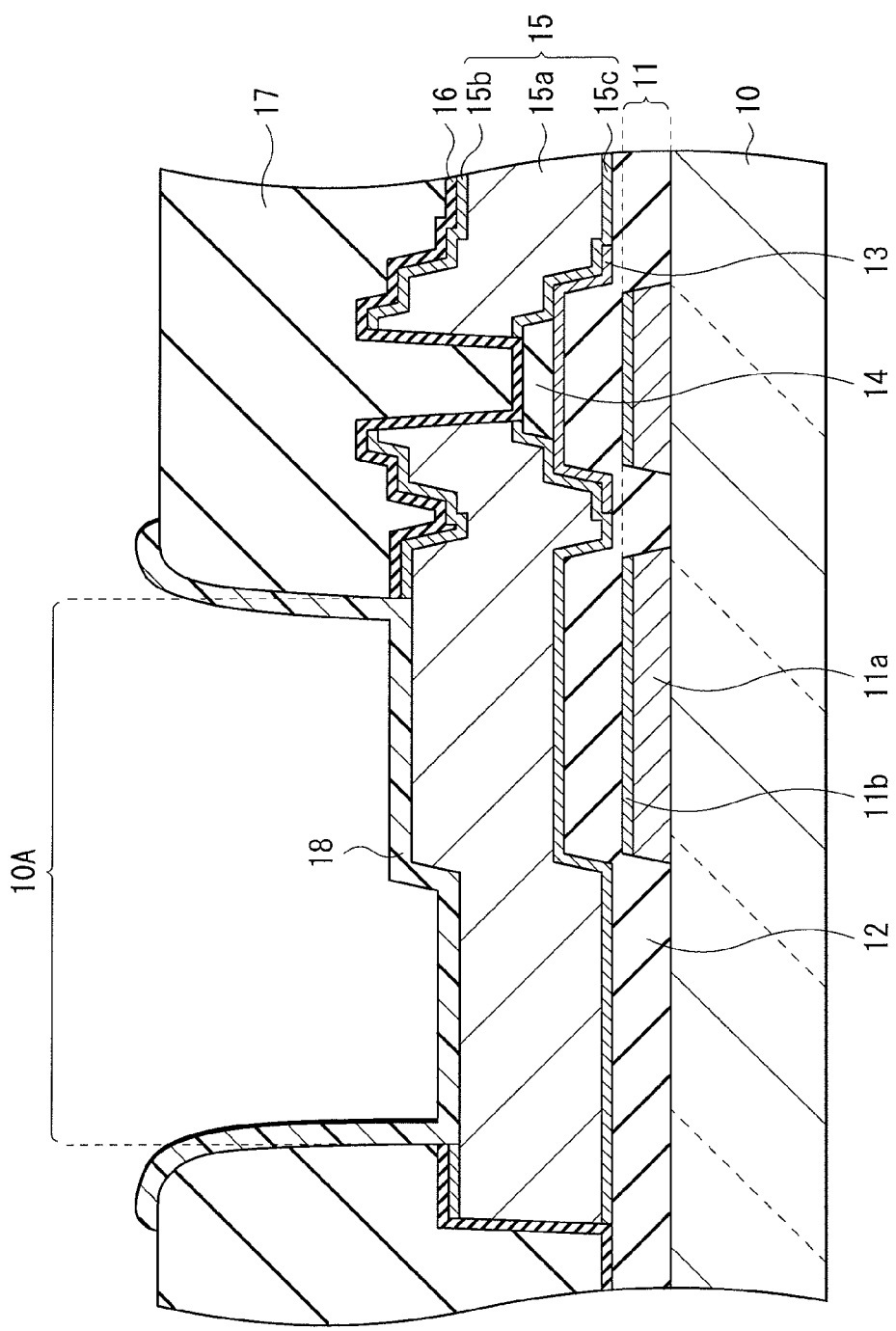
FIG. 11 is a diagram illustrating a step following the step in FIG. 10.

Then, as illustrated in FIG. 11, the organic layer 18 including the light-emitting layer is formed on the exposed electrode layer 15a by, for example, a vacuum deposition method. Finally, the cathode electrode 19 is formed on the organic layer 18 by, for example, a sputtering method or an evaporation method so as to be laid over the whole surface of the substrate 10, thereby the display 1 illustrated in FIG. 1 is completed.

As described above, in the steps of manufacturing the display 1, the gate electrode layer 11, the gate insulating film 12 and the semiconductor layer 13 are formed in order on the substrate 10, and then the source-drain electrode layer 15 is formed in the region including the regions 10A and 10B. Then, after the inter-pixel insulating film 17 is formed, a part corresponding to the region 10A of the upper metal layer 15b in the source-drain electrode layer 15 is selectively removed so that a surface of the electrode layer 15a made of reflection metal is allowed to be exposed in the region 10A. When the organic layer 18 and the cathode electrode 19 are formed on the exposed electrode layer 15a, the organic EL element 1a using the source-drain electrode layer 15 (the electrode layer 15a) as an anode electrode is allowed to be formed in the region 10A.

Figure 12:
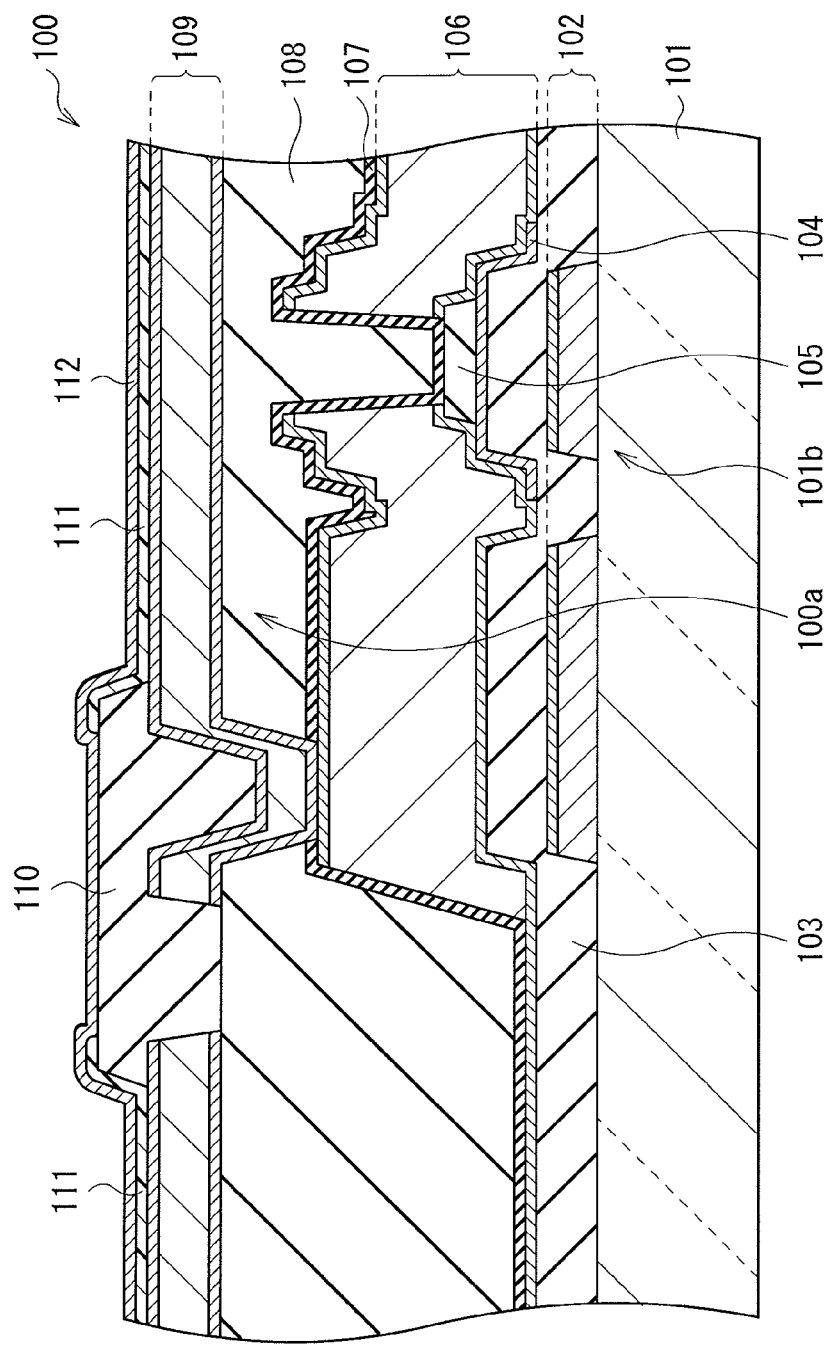
FIG. 12 is a sectional view illustrating a display according to a comparative example.

Now, FIG. 12 illustrates a sectional configuration of a display 100 according to a comparative example. As illustrated in the drawing, the display 100 includes an organic EL element 100a and a TFT 100b on a substrate 101, and in the comparative example, the TFT 101b is arranged below an anode electrode 109 of the organic EL element 100a. More specifically, in the TFT 100b, a gate electrode layer 102, a gate insulating film 103, a semiconductor layer 104, a channel protective film 105 and a source-drain electrode layer 106, and a protective film 107 are formed in this order on the substrate 101. Then, on such a TFT 100b, a planarization film 108 is formed on a whole surface of the substrate 101, and a contact hole for providing conduction to the source-drain electrode layer 106 is arranged. An anode electrode 109 is formed on the planarization film 108 so that the contact hole is filled with the anode electrode 109. An inter-pixel insulating film 110 having an opening is formed on the anode electrode 109, and an organic layer 111 and a cathode electrode 112 are formed in order in an opening part of the inter-pixel insulating film 110.

In such a display 100 according to the comparative example, the organic EL element 100a and the TFT 100b are formed with the planarization film 108 in between, so after the TFT 100b is formed, the organic EL element 100a is formed after a step of forming the planarization film 108 and a step of patterning the planarization film 108 (a step of forming the contact hole). Therefore, the number of manufacturing steps and the number of film formation materials is increased to easily cause an increase in cost.

On the other hand, in the embodiment, as described above, when the source-drain electrode layer 15 (the electrode layer 15a) in the TFT 1b functions as the anode electrode of the organic EL element 1a, the above-described step of forming the planarization film and the above-described step of patterning the planarization film are not necessary, and it is not necessary to form the anode electrode separately. Therefore, steps of manufacturing the display 1 are allowed to be simplified.

Moreover, in the embodiment, as the source-drain electrode layer 15, a multilayer film configuration in which the lower metal layer 15c, the electrode layer 15a and the upper metal layer 15b are laminated in order is used. Thereby, when the inter-pixel insulating film 17 having the opening 17A in the region 10A is pattern-formed in a later step, the upper metal layer 15b functions as a protective layer for the electrode layer 15a so that damage to the electrode layer 15a is preventable. Then, the upper metal layer 15b is easily removable by etching with use of, as a mask, the inter-pixel insulating film 17 formed thereon. Therefore, the surface of the electrode layer 15a with good light reflectivity is exposed, and the electrode layer 15a is allowed to favorably function as the anode electrode of the organic EL element 1a.

Further, in the embodiment, an opaque metal material is used as the lower metal layer 15c and the upper metal layer 15b. Typically, as an anode electrode of an organic EL display, a transparent conductive film such as ITO (indium tin oxide) is often used. In this case, for example, it is considered that a laminate film configuration including a transparent conductive film as an upper layer and a light reflection metal film such as an aluminum alloy as a lower layer is used as a source-drain electrode. In such a case, instead of removing the transparent conductive film in the region 10A, light transmittance in the transparent conductive film may be enhanced by performing an oxidation process.

However, the source-drain electrode preferably has a laminate film configuration using an opaque metal material as in the case of the embodiment because of the following reason. When the transparent conductive film is used, it is necessary to laminate an oxide film such as ITO and a light reflection metal film such as aluminum, but these film materials have different etching properties from each other, so it is difficult to have good electrode shape (a tapered shape) in a step of pattering an electrode. Moreover, the transparent conductive film easily produces dust during formation thereof. Therefore, there is an issue that the dust easily causes a defect such as a short in the source-drain electrode layer 15 (or a signal line or the like formed in the same layer as a layer where the source-drain electrode layer 15 is formed) or a short between the source-drain electrode layer 15 and a cathode electrode layer. Therefore, when an opaque metal, for example, a metal such as molybdenum or titanium is used for the upper electrode layer 15b in the source-drain electrode layer 15, compared to the case where the transparent conductive film is used, there are advantages that an electrode is easily patterned and it is less likely to produce dust or the like during film formation.

Second Embodiment

Configuration of Display 2

Figure 13:
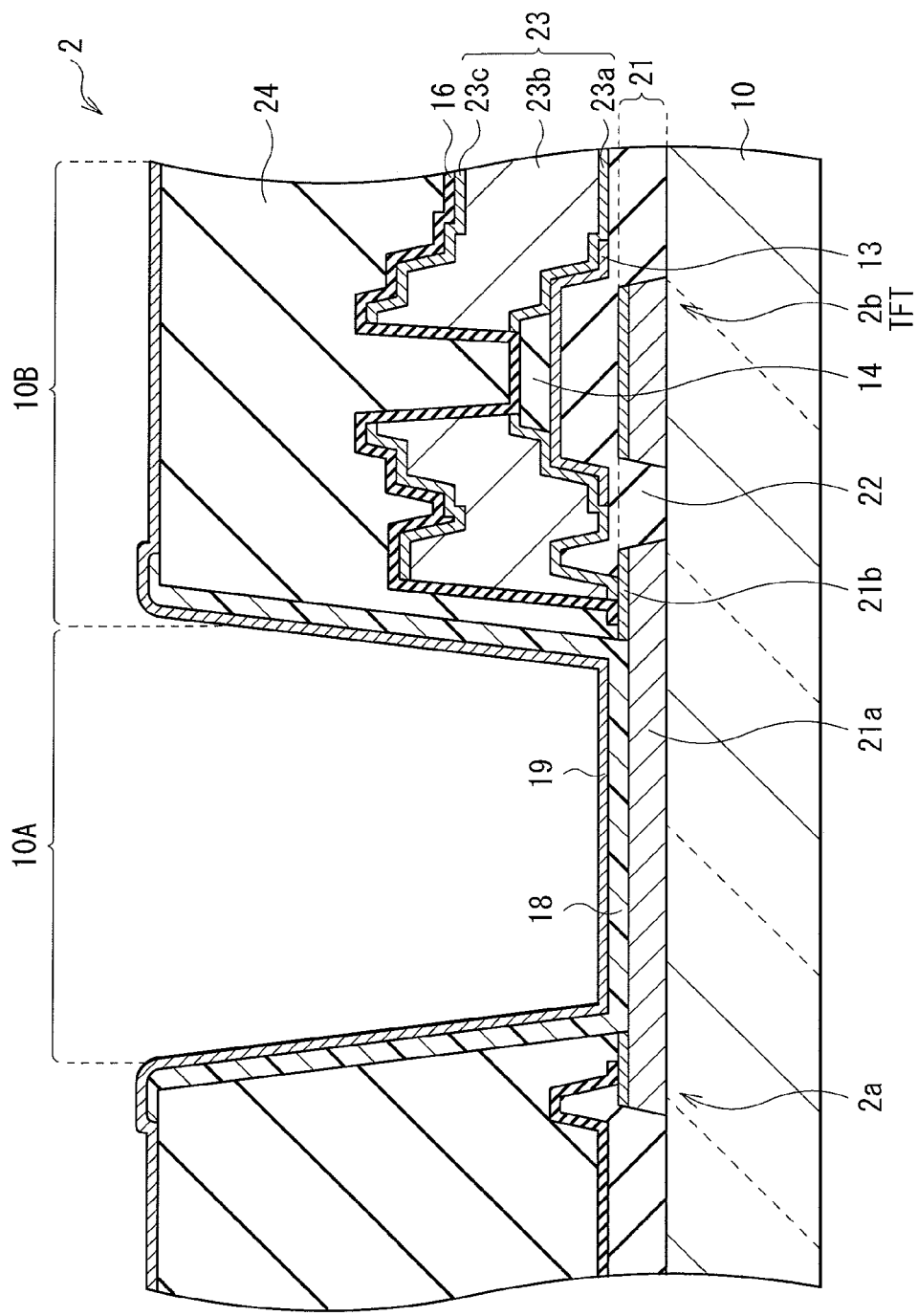
FIG. 13 is a sectional view illustrating a display according to a second embodiment.

FIG. 13 illustrates a sectional configuration of a display 2 according to a second embodiment. The display 2 is, for example, an active matrix organic EL display as in the case of the display 1 according to the first embodiment, and in each pixel, an organic EL element 2a and a TFT 2b are arranged in the region 10A and the region 10B on the substrate 10, respectively. However, in the embodiment, a gate electrode layer 21 in the TFT 2b functions as an anode electrode of the organic EL element 2a. Like components are denoted by like numerals as of the first embodiment, and will not be further described.

TFT 2b

The TFT 2b is a so-called bottom gate type (an inverted stagger configuration) TFT, and in the TFT 2b, the gate electrode layer 21, a gate insulating film 22, the semiconductor layer 13, the channel protective film 14 and a source-drain electrode layer 23, and the protective film 16 are formed in order on the substrate 10.

As in the case of the gate electrode layer 11 in the first embodiment, the gate electrode layer 21 controls carrier density in the semiconductor layer 13 by a gate voltage applied to the display 2. Moreover, the gate electrode layer 21 has a multilayer film configuration in which a plurality of metal films including an electrode layer 21a are laminated, and the gate electrode layer 21 includes not only a gate electrode in the TFT 2b but also another electrode arranged in the same layer as a layer where the gate electrode is arranged and formed in the same laminate film configuration as that of the gate electrode, for example, a lower electrode or the like of a capacitor. As the multilayer film configuration, for example, a two-layer configuration including an upper metal layer 21b on the electrode layer 21a is used. The electrode layer 21a is made of, for example, a simple substance of aluminum or silver, an aluminum alloy or a silver alloy, or a laminate film thereof, and has a thickness of, for example, 100 nm to 500 nm. The upper metal layer 21b includes, for example, molybdenum (Mo) or titanium (Ti), and has a thickness of, for example, 10 nm to 200 nm.

In the above-described multilayer film configuration, more specifically, the electrode layer 21a has a function as a gate electrode controlling carrier density and wiring supplying a potential. The upper metal layer 21b is arranged so as to secure contact between the electrode layer 21a and the source-drain electrode layer 23 (electrical contact through a contact hole (not illustrated)) and to protect the electrode layer 21a from corrosion.

In the embodiment, the gate electrode layer 21 is formed not only in the region 10B where the TFT 2b is arranged but also in the region 10A where the organic EL element 2a is arranged. Thereby, as will be described in detail later, the electrode layer 21a in the gate electrode layer 21 functions as an anode electrode of the organic EL element 2*a* (also serves as the anode electrode). Therefore, the electrode layer 21*a* is preferably formed of a metal material with light reflectivity of 70% or over. The above-described aluminum or silver often exhibits light reflectivity of 90% or over, and is suitable for the electrode layer 21*a* in the embodiment.

As in the case of the gate insulating film 12 in the first embodiment, the gate insulating film 22 is a single-layer film configured of one kind selected from the group consisting of a silicon oxide film, a silicon nitride film, a silicon oxynitride film and an aluminum oxide film and the like, or a laminate film configured of two or more kinds selected from the group. However, in the embodiment, an opening (an opening 22A which will be described later) is formed corresponding to the region 10A.

As in the case of the first embodiment, the source-drain electrode layer 23 is separated into parts in a region corresponding to a channel of the semiconductor layer 13, and one of the parts functions as a source electrode and the other functions as a drain electrode. Moreover, the source-drain electrode layer 23 has, for example, a three-layer configuration in which a lower metal layer 23*c*, an electrode layer 23*a* and an upper metal layer 23*b* are laminated in order from a side close to the semiconductor layer 13. The electrode layer 23*a* among them is made of a low-resistance metal material, for example, a simple substance of aluminum (Al), silver (Ag) or copper (Cu), an aluminum alloy, a silver alloy or a copper alloy, or a laminate film thereof, and has a thickness of, for example, 100 nm to 1000 nm. The upper metal layer 23*b* and the lower metal layer 23*c* are made of, for example, an opaque metal material such as molybdenum (Mo) or titanium (Ti), and have a thickness of, for example, 1 nm to 100 nm. In such a three-layer configuration, the electrode layer 23*a* functions as the source and the drain of the TFT 1*b* and wiring supplying a potential, and upper metal layer 23*b* and the lower metal layer 23*c* have a function of preventing corrosion in the electrode layer 23*a*. The lower metal layer 23*c* also has a function of securing contact between the electrode layer 23*a* and a layer therebelow (in this case, the semiconductor layer 13 or the like).

However, in the embodiment, the source-drain electrode layer 23 is formed only in the region 10B. Moreover, at least in the lower metal layer 23*c* in the above-described three-layer configuration, a metal material different from that of the upper metal layer 21*b* is used so as to obtain etching selectivity with respect to the upper metal layer 21*b* in the gate electrode layer 21. For example, in the case where molybdenum is used for the upper metal layer 21*b* of the gate electrode layer 21, titanium may be used for the lower metal layer 23*c* of the source-drain electrode layer 23.

On the above-described TFT 2*b*, the inter-pixel insulating film 24 is formed on a whole surface of the substrate 10. The inter-pixel insulating film 24 has an opening in the region 10A, and the organic EL element 2*a* is arranged corresponding to the opening in the inter-pixel insulating film 24. The inter-pixel insulating film 24 is made of the same material as that of the inter-pixel insulating film 17 in the first embodiment.

Organic EL Element 2*a*

As in the case of the organic EL element 1*a* in the first embodiment, the organic EL element 2*a* is, for example, a top emission light-emitting element in which light of one of colors R, G and B is emitted from a top surface. However, the organic EL element 2*a* uses the gate electrode layer 21 (more specifically, the electrode layer 21*a*) formed in the region 10A as an anode electrode, and includes the organic layer 18 including a light-emitting layer and the cathode electrode 19 in order on the gate electrode layer 21.

Method of Manufacturing Display 2

FIGS. 14 to 20 are diagrams for describing a method of manufacturing the display 2. The display 2 is manufacturable by, for example, the following steps.

Figure 14:
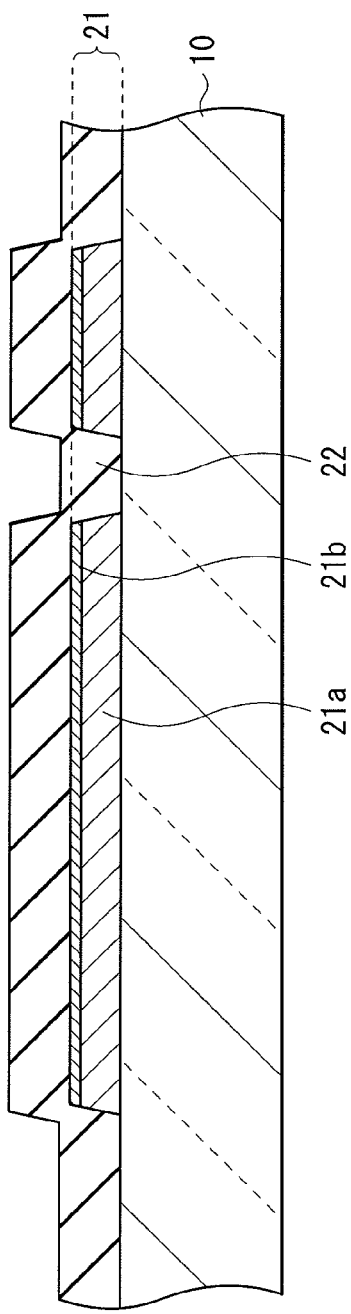
FIG. 14 is a diagram illustrating a step of a method of manufacturing the display illustrated in FIG. 13.

First, as illustrated in FIG. 14, as in the case of the first embodiment, the gate electrode layer 21 and the gate insulating film 22 are formed in order on the substrate 10.

Next, as illustrated in FIG. 15A, as in the case of the first embodiment, the semiconductor layer 13 and the channel protective film 14 are formed and patterned into a desired shape.

Then, as illustrated in FIG. 15B, the opening 22A is formed in a part corresponding to the region 10A of the gate insulating film 22 by patterning with use of, for example, a photolithography method so that the upper metal layer 21*b* of the gate electrode layer 21 is exposed in the region 10A. Moreover, at this time, a contact hole (not illustrated) for providing conduction to the gate electrode layer 21 is formed.

Figure 16:
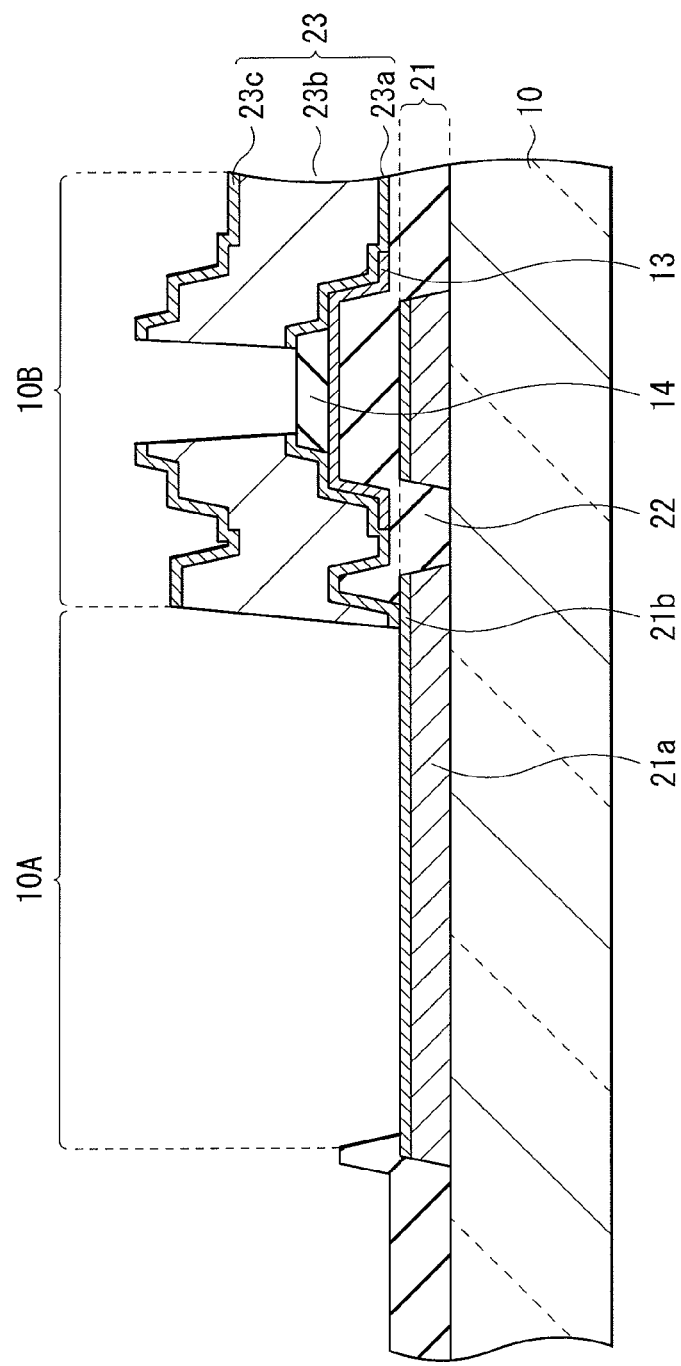
FIG. 16 is a diagram illustrating a step following the step in FIG. 15.

Next, as illustrated in FIG. 16, a metal multilayer film in which, for example, titanium, aluminum and titanium are laminated in order is formed on the substrate 10 by, for example, a sputtering method. After that, a part corresponding to the region 10A of the formed metal multilayer film is removed by wet etching with use of, for example, a photolithography method, and the metal multilayer film is patterned into a desired shape to form the source-drain electrode layer 23.

Figure 17:
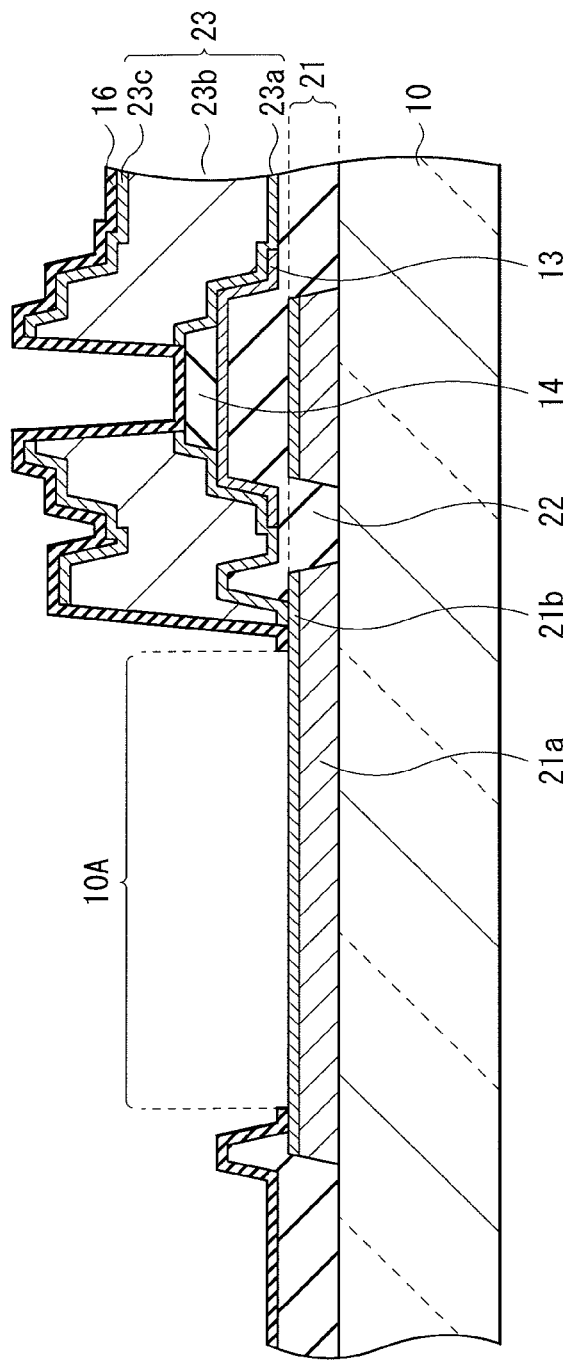
FIG. 17 is a diagram illustrating a step following the step in FIG. 16.

Then, as illustrated in FIG. 17, the protective film 16 is formed on the whole surface of the substrate 10 by, for example, a sputtering method or an atomic layer deposition method, and then patterning by, for example, a photolithography method is performed to remove a part corresponding to the region 10A of the formed protective film 16.

Figure 18:
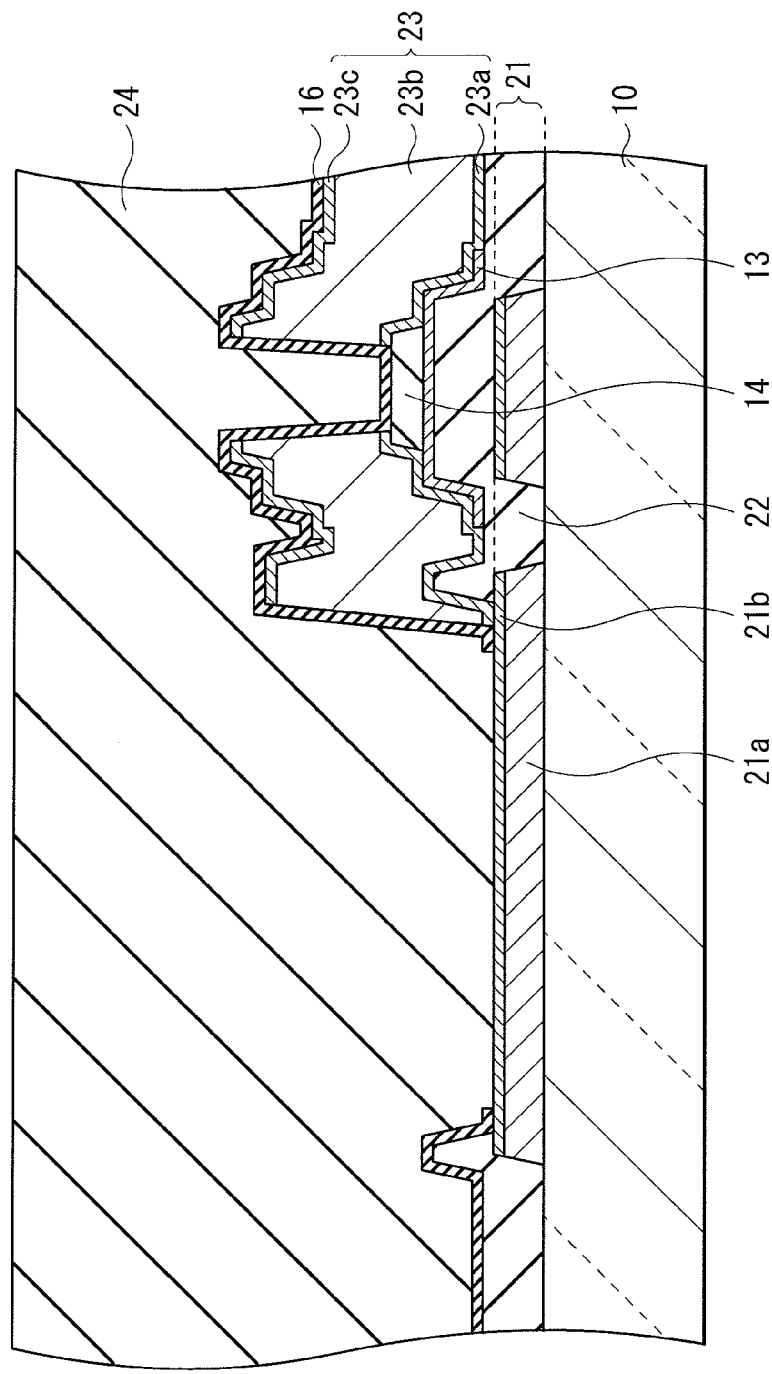
FIG. 18 is a diagram illustrating a step following the step in FIG. 17.

Next, as illustrated in FIG. 18, first, as in the case of the inter-pixel insulating film 17 in the first embodiment, the inter-pixel insulating film 24 is formed on the whole surface of the substrate 10.

Figure 19:
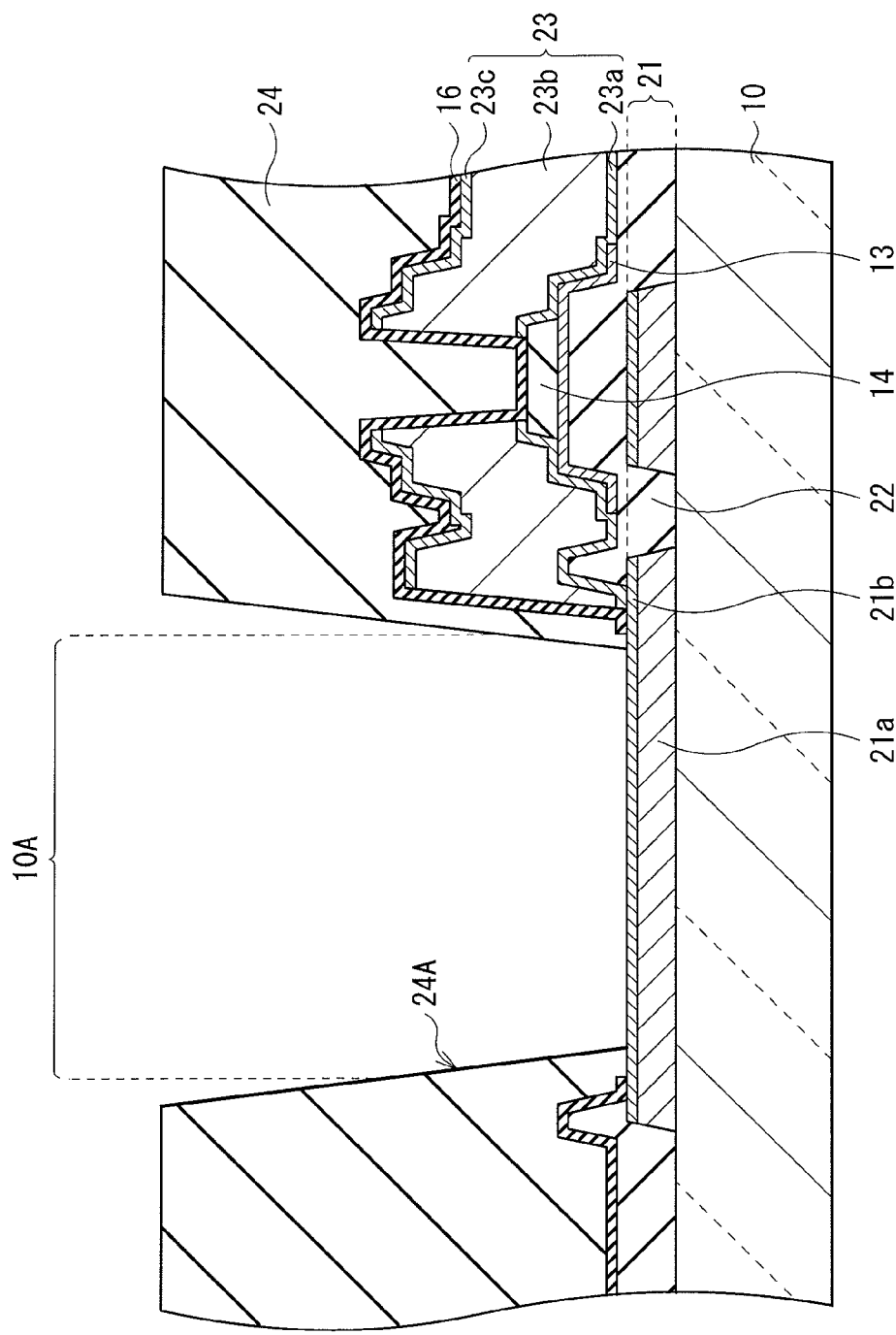
FIG. 19 is a diagram illustrating a step following the step in FIG. 18.

After that, as illustrated in FIG. 19, as in the case of the inter-pixel insulating film 17 in the first embodiment, the formed inter-pixel insulating film 24 is patterned by, for example, a photolithography method to form the opening 24A in the region 10A. At this time, the gate electrode layer 21 has a multilayer film configuration in which the upper metal layer 21*b* made of Mo or the like is laminated on a top surface of the electrode layer 21*a*, so the upper metal layer 21*b* functions as a protective film so that damage to the electrode layer 21*a* is preventable.

Figure 20:
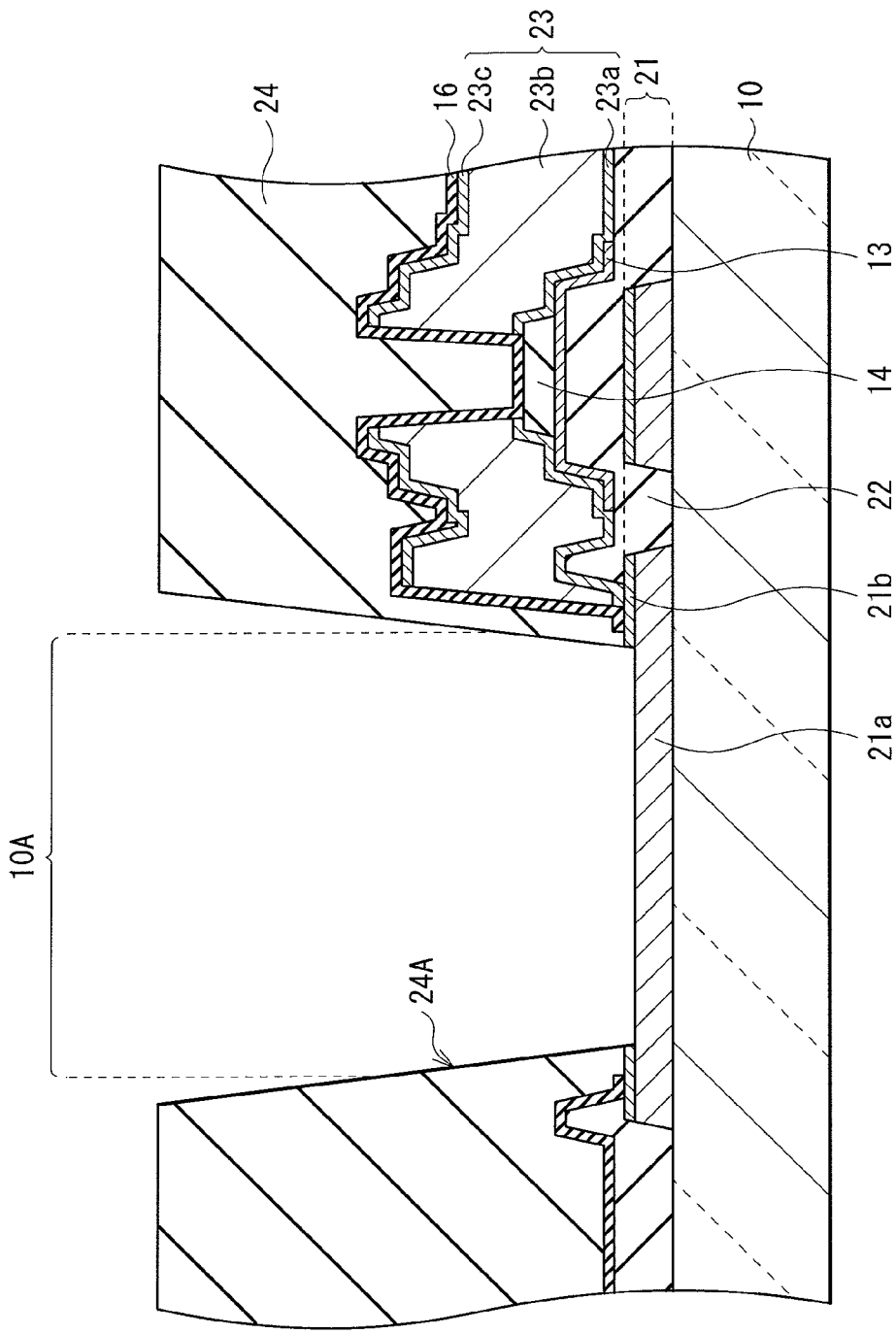
FIG. 20 is a diagram illustrating a step following the step in FIG. 19.

Then, as illustrated in FIG. 20, only a part corresponding to the region 10A of the upper metal layer 21*b* in the gate electrode layer 21 is selectively removed. At this time, etching is performed with use of, as a mask, the inter-pixel insulating film 24 having the opening 24A in the region 10A. Thereby, in the region 10A, the electrode layer 21*a* having good light reflectivity is exposed.

Finally, as in the case of the first embodiment, the organic layer 18 and the cathode electrode 19 are formed in order on the exposed electrode layer 21*a* so as to complete the display 2 illustrated in FIG. 13.

As described above, in the steps of manufacturing the display 2, the gate electrode layer 21, the gate insulating film 22, the semiconductor layer 13, the channel protective film 14 and the source-drain electrode layer 23 are formed on the substrate 10. Then, after the inter-pixel insulating film 24 is formed, a part corresponding to the region 10A of the upper metal layer 21b in the gate electrode layer 21 is selectively removed so that the surface of the electrode layer 21a made of a reflection metal is allowed to be exposed in the region 10A. When the organic layer 18 and the cathode electrode 19 are formed on the exposed electrode layer 21a, the organic EL element 2a using the gate electrode layer 21 (the electrode layer 21a) as an anode electrode is allowed to be formed in the region 10A.

In other words, also in the embodiment, as in the case of the first embodiment, the step of forming the planarization film and the step of patterning the planarization film are not necessary, and it is not necessary to form an anode electrode separately. Therefore, steps of manufacturing the display 2 are allowed to be simplified.

Then, as the gate electrode layer 21, a multilayer film configuration in which the upper metal layer 21b is laminated on the top surface of the electrode layer 21a is used. Thereby, when the inter-pixel insulating film 24 having the opening 24A in the region 10A is pattern-formed in a later step, the upper metal layer 21b functions as a protective layer for the electrode layer 21a so that damage to the electrode layer 21a is preventable. Then, the upper metal layer 21b is easily removable by etching with use of the inter-pixel insulating film 24 formed thereon as a mask. Thereby, the surface of the electrode layer 21a with good light reflectivity is exposed, and the electrode layer 21a is allowed to suitably function as the anode electrode of the organic EL element 2a.

Further, also in the embodiment, an opaque metal material is used for the upper metal layer 21b, so compared to the case where a transparent conductive film is used, an electrode is easily patterned, and dust is less likely to be produced during film formation. In addition, also in the source-drain electrode layer 23, the upper metal layer 23b and the lower metal layer 23c are preferably made of an opaque metal material because of the same reason.

However, in the embodiment, as the gate electrode layer 21 is used as an anode electrode, a decline in yield is preventable. Typically, migration such as hillocks or whiskers may occur on a surface of aluminum, silver or the like by a later heat step to cause a short defect between electrodes. To prevent such a defect and enhance heat resistance, it is consider to add a rare earth element such as neodymium to alloy. However, there is a disadvantage that alloying increases resistance to cause an increase in the time constant of a signal line performing complicated signal writing, thereby a pulse is weakened to induce a writing failure. Moreover, in the case where the display is used for a panel with a high frame rate, it is desired for the source-drain electrode layer 23 to have smaller resistance, and it is necessary to increase the thickness of the source-drain electrode layer 23. When the thickness of the source-drain electrode layer 23 is increased, the roughness of an electrode surface is increased to cause an increase in failures or the like due to a decline in reflectivity, a decline in interlayer insulation of an EL layer formed thereon.

Compared to the source-drain electrode layer (or a signal line in the same layer as a layer where the source-drain electrode layer is arranged), it is not necessary for the gate electrode layer 21 to have low resistance, and the film formation temperature of a gate insulating film in a later step is as high as 350° C. to 450° C. Therefore, alloying is necessary to improve heat resistance, but even if alloying is performed, at the film formation temperature of the gate insulating film in the later step, an impurity is segregated to easily reduce resistance. Thus, an alloyed material is easily used for the gate electrode layer 21 to enhance heat resistance. Moreover, as the material of the gate electrode layer 21 is alloyed, grains are very small, and a relatively thin film is allowed to be formed, so surface roughness is prevented, and a decline in yield due to a short defect between the gate electrode layer 21 and a cathode electrode formed thereon is less likely to occur. Therefore, compared to the first embodiment in which the source-drain electrode layer 15 is used as the anode electrode, in the embodiment in which the gate electrode layer 21 is used as the anode electrode, a decline in yield is further preventable, and a signal line with lower resistance is allowed to be prepared.

Third Embodiment

Configuration of Display 3

Figure 21:
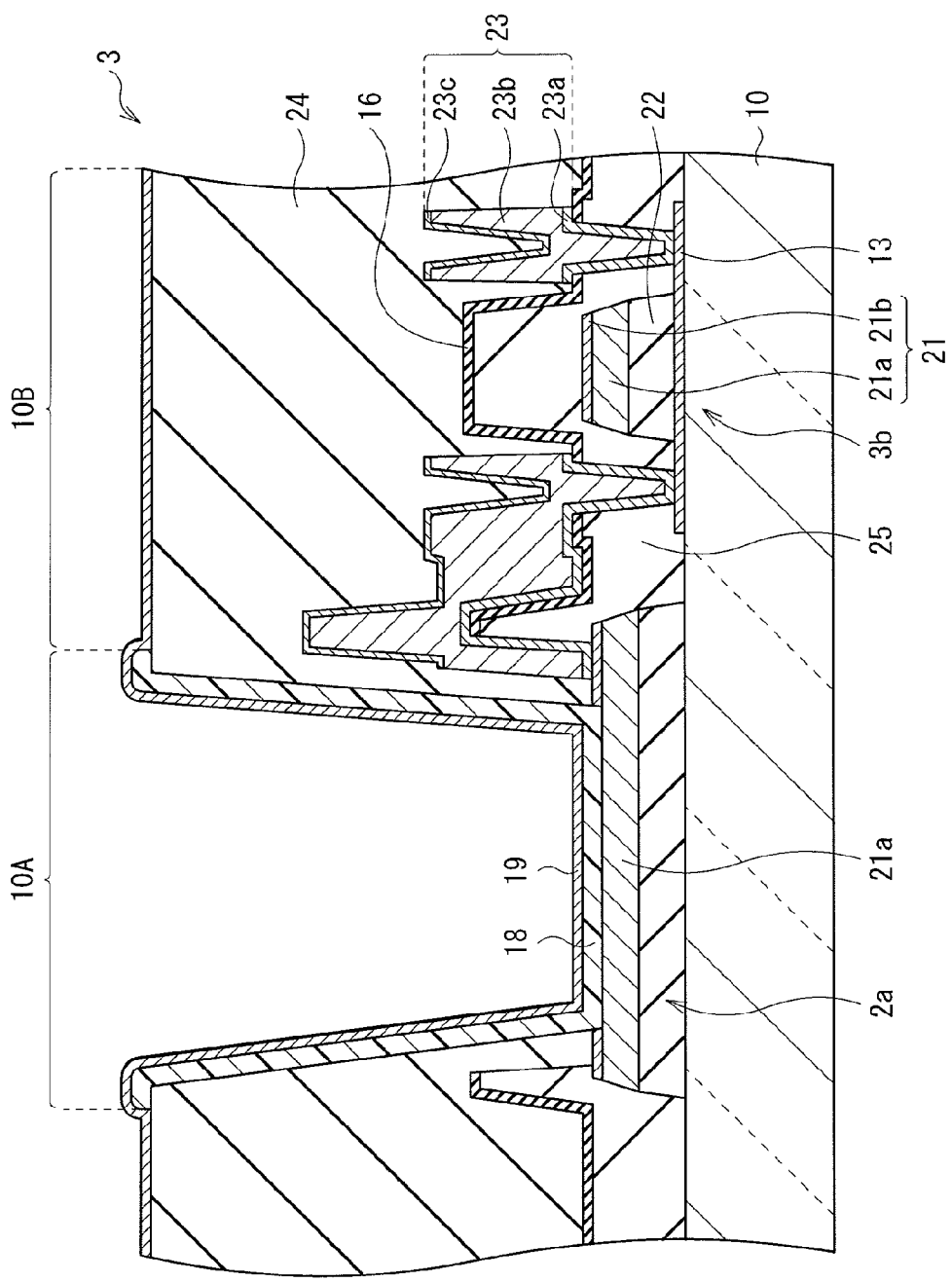
FIG. 21 is a sectional view illustrating a display according to a third embodiment.

FIG. 21 illustrates a sectional configuration of a display 3 according to a third embodiment. The display 3 is, for example, an active matrix organic EL display as in the case of the display 1 according to the first embodiment, and in each pixel, the organic EL element 2a and a TFT 3b are arranged in the region 10A and the region 10B on the substrate 10, respectively. Moreover, as in the case of the second embodiment, the gate electrode layer 21 (the electrode layer 21a) is used as the anode electrode of the organic EL element 2a, and the source-drain electrode layer 23 is formed only in the region 10B. Like components are denoted by like numerals as of the first and second embodiments, and will not be further described.

TFT 3b

The TFT 3b is a so-called top gate type TFT, and in the TFT 3b, the semiconductor layer 13, a gate insulating film 22, the gate electrode layer 21, an interlayer insulating film 25, the protective film 16 and the source-drain electrode layer 23 are formed in order on the substrate 10. In other words, in the embodiment, the laminating order (process order) of layers of a TFT is different from that in the first and second embodiments. More specifically, the semiconductor layer 13 is formed in a lowest layer on a side close to the substrate 10, and the gate electrode layer 21 is formed on a predetermined region of the semiconductor layer 13 with the gate insulating film 22 in between. The interlayer insulating film 25 is formed over the semiconductor layer 13, the gate insulating film 22 and the gate electrode layer 21, and has a pair of contact holes (contact holes 25B which will be described later) facing parts of the semiconductor layer 13. The source-drain electrode layer 23 is arranged so that the contact holes 25B are filled with the source-drain electrode layer 23. In this case, the protective film 16 is formed on a surface of the interlayer insulating film 25 (except for an opening part of the region 10A and a contact hole for forming a source and a drain). The interlayer insulating film 25 is a single-layer film configured of one kind selected from the group consisting of a silicon oxide film, a silicon nitride film, a silicon oxynitride film and an aluminum oxide film and the like, or a laminate film configured of two or more kinds selected from the group.

Method of Manufacturing Display 3

FIGS. 22A and 22B to FIG. 27 are diagrams for describing a method of manufacturing the display 3. The display 3 is manufacturable by, for example, the following steps.

First, as illustrated in FIG. 22A, as in the case of the first embodiment, the semiconductor layer 13 is formed on the substrate 10, and is patterned into a desired shape. Next, the gate insulating film 22 is pattern-formed in a predetermined region (a part on the semiconductor layer 13) in the region 10B on the substrate 10.

Figure 23:
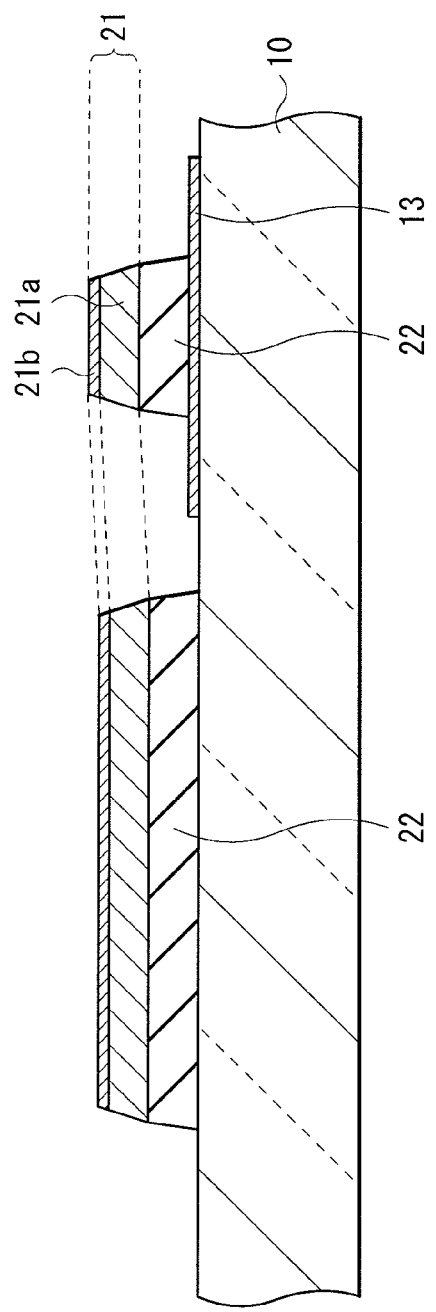
FIG. 23 is a diagram illustrating a step following the step in FIG. 22.

Then, as illustrated in FIG. 23, the gate electrode layer 21 is pattern-formed on the formed gate insulating film 22 by the same technique as that in the first embodiment.

Figure 24:
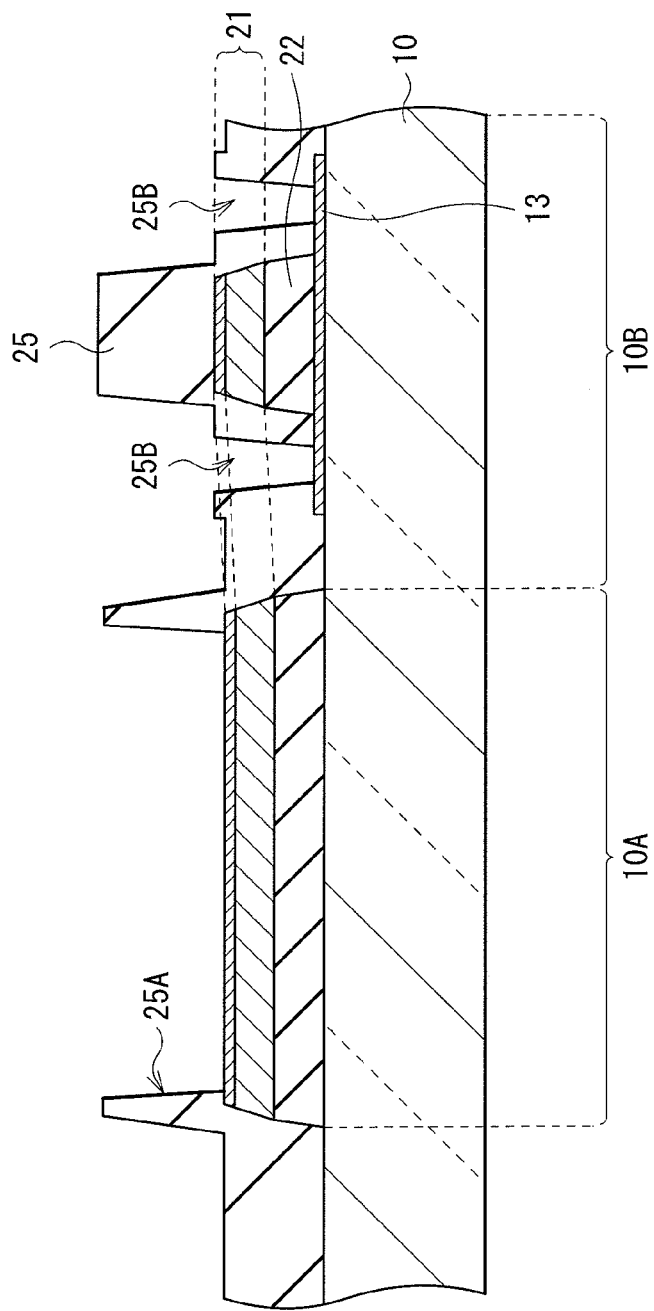
FIG. 24 is a diagram illustrating a step following the step in FIG. 23.

Next, as illustrated in FIG. 24, the interlayer insulating film 25 made of the above-described material is formed on a whole surface of the substrate 10 by, for example, a plasma CVD method, and then the opening 25A is formed in a part corresponding to the region 10A by, for example, a photolithography method so as to expose the upper metal layer 21b of the gate electrode layer 21 in the region 10A. Moreover, when the opening 25A is formed, a pair of contact holes 25B for conduction between the semiconductor layer 13 and the source-drain electrode layer 23 are formed.

Figure 25:
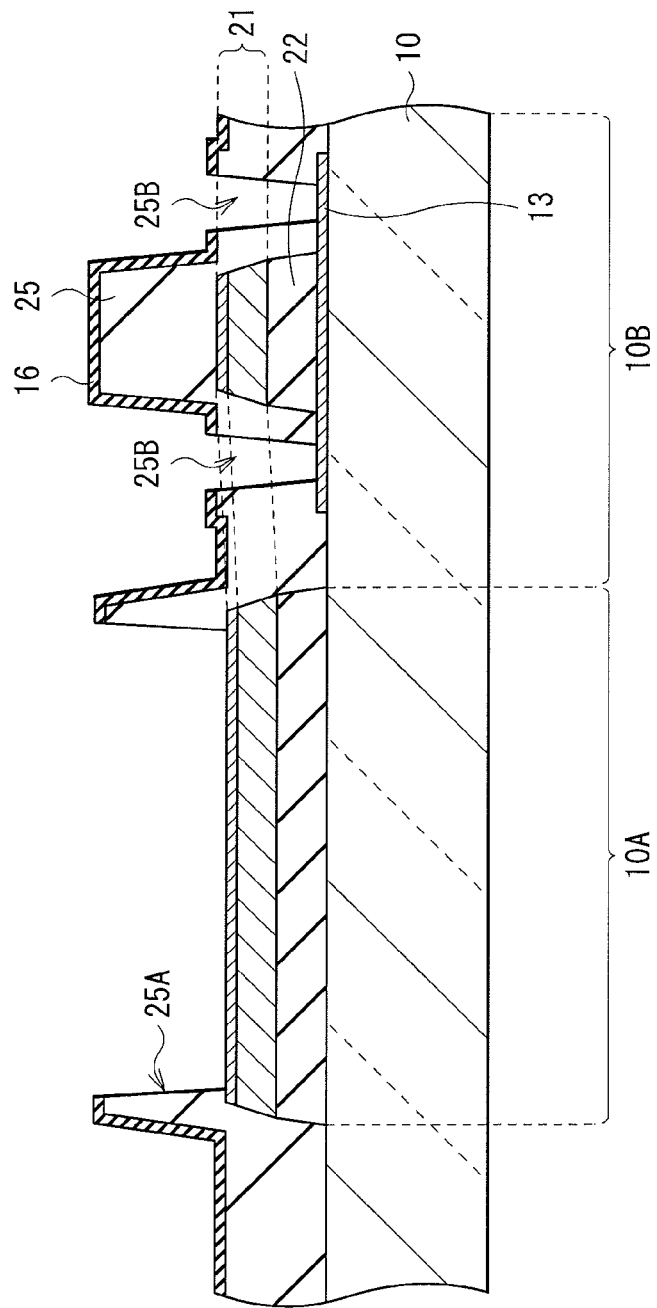
FIG. 25 is a diagram illustrating a step following the step in FIG. 24.

Then, as illustrated in FIG. 25, the protective film 16 is formed on the whole surface of the substrate 10 by, for example, a sputtering method or an atomic layer deposition method, and then patterning by, for example, a photolithography method is performed to remove parts, corresponding to the opening 25A and the contact holes 25B of the interlayer insulating film 25, of the protective film 16. Alternatively, after the above-described interlayer insulating film 25 and the protective film 16 are formed in order on the whole surface of the substrate 10, these two layers may be etched to form the opening 25A and the contact holes 25B.

Figure 26:
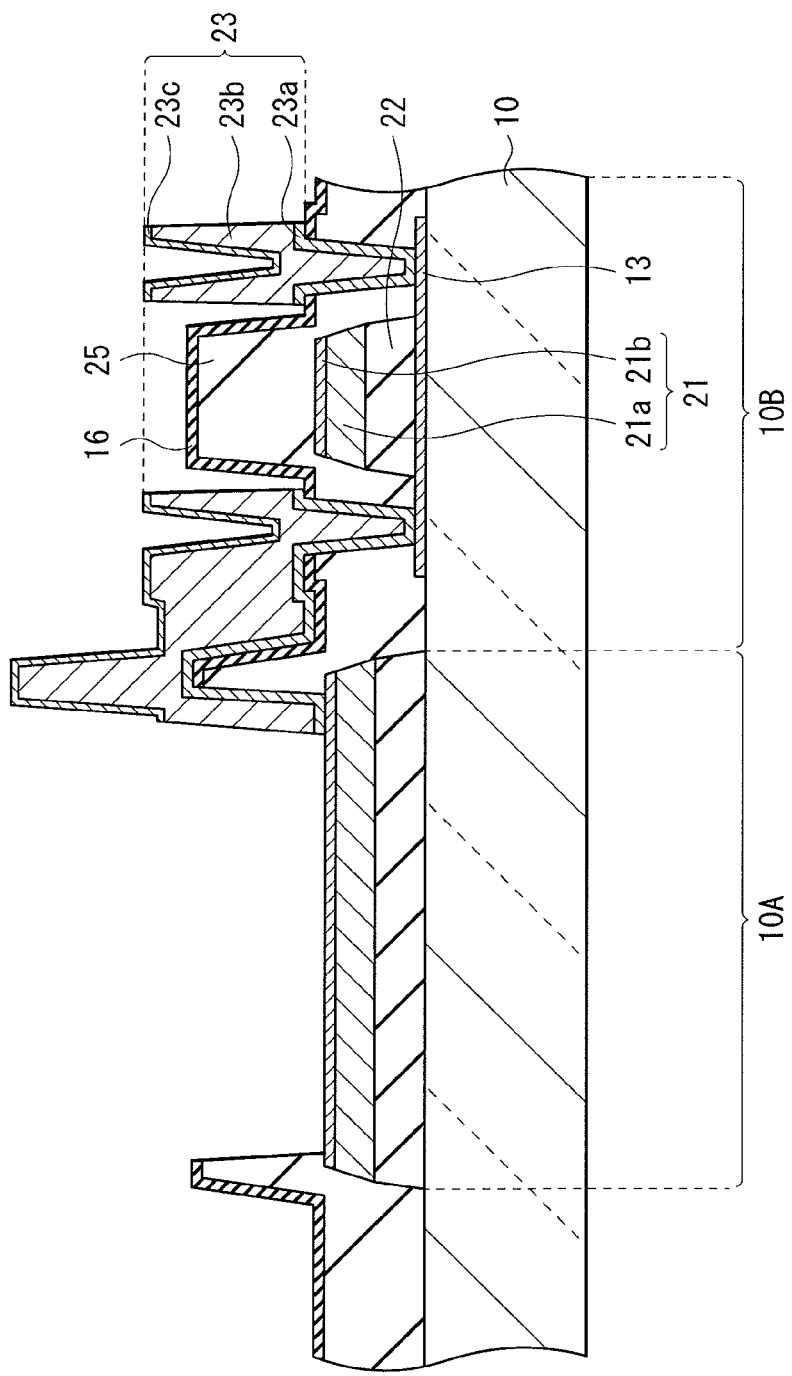
FIG. 26 is a diagram illustrating a step following the step in FIG. 25.

Next, as illustrated in FIG. 26, a metal multilayer film in which, for example, titanium, aluminum and titanium are laminated in order is formed on the substrate 10 by, for example, a sputtering method. After that, a part corresponding to the region 10A of the formed metal multilayer film is removed by wet etching with use of, for example, a photolithography method, and the metal multilayer film is patterned into a desired shape to form the source-drain electrode layer 23.

Figure 27:
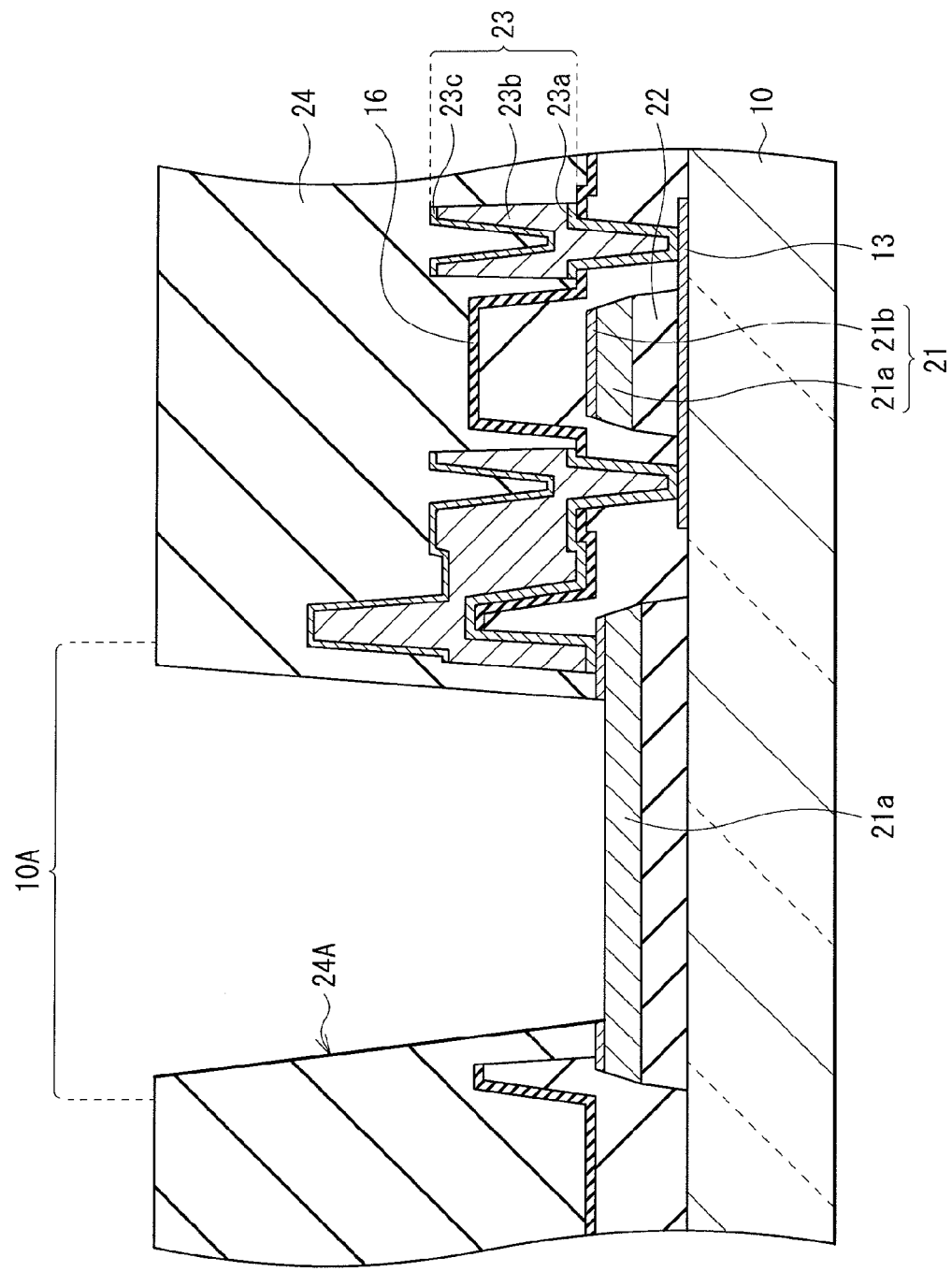
FIG. 27 is a diagram illustrating a step following the step in FIG. 26.

Then, as illustrated in FIG. 27, as in the case of the second embodiment, the inter-pixel insulating film 24 having the opening 24A in the region 10A is formed on the whole surface of the substrate 10, and then only a part corresponding to the region 10A of the upper metal layer 21b in the gate electrode layer 21 is selectively removed. Also in the embodiment, when the inter-pixel insulating film 24 is formed, in the gate electrode layer 21, the upper metal layer 21b functions as the protective film for the electrode layer 21a to prevent damage to the electrode layer 21a. Moreover, when the upper metal layer 21b is selectively removed, etching with use of the inter-pixel insulating film 24 as a mask is performed so as to expose the electrode layer 21a as a reflection electrode in the region 10A.

Finally, as in the case of the first embodiment, the organic layer 18 and the cathode electrode 19 are formed in order on the exposed electrode layer 21a so as to complete the display 3 illustrated in FIG. 21.

As described above, in the steps of manufacturing the display 3, the semiconductor layer 13, the gate insulating film 22, the gate electrode layer 21, the interlayer insulating film 25, the protective film 16 and the source-drain electrode layer 23 are formed on the substrate 10. Then, as in the case of the second embodiment, after the inter-pixel insulating film 24 is formed, a part corresponding to the region 10A of the upper metal layer 21b in the gate electrode layer 21 is selectively removed so that a surface of the electrode layer 21a is allowed to be exposed in the region 10A. When the organic layer 18 and the cathode electrode 19 are formed on the exposed electrode layer 21a, the organic EL element 2a using the gate electrode layer 21 (the electrode layer 21a) as the anode electrode is allowed to be formed in the region 10A.

Therefore, also in the embodiment, as in the case of the first embodiment, the step of forming the planarization film and the step of patterning the planarization film are not necessary, and it is not necessary to form the anode electrode separately, so steps of manufacturing the display 3 are allowed to be simplified. Moreover, as the gate electrode layer 21 has a multilayer film configuration including the upper metal layer 21b, damage to the electrode layer 21a during patterning the inter-pixel insulating film 24 is preventable. Further, as the gate electrode layer 21 is used as the anode electrode, compared to the case where the source-drain electrode layer is used as the anode, a decline in yield is preventable. Therefore, the same effects as those in the first and second embodiments are obtainable.

In the third embodiment, there is described the case where a configuration formed by laminating the semiconductor layer 13, the gate insulating film 22, the gate electrode layer 21, the interlayer insulating film 25 and the source-drain electrode layer 23 in order from a side close to the substrate 10 is used as an example of the TFT 3b and the gate electrode layer 21 functions as the anode electrode of the organic EL element 2a. In other words, the third embodiment corresponds to another example of the laminate configuration and the process of the TFT in the second embodiment, and such a TFT 3b is applicable to the first embodiment. In other words, the source-drain electrode layer 23 in the TFT 3b may be formed over the region 10A and the region 10B, and the upper metal layer 23c may be removed, and the electrode layer 23b may function as an anode.

Whole Configurations of Displays 1 and 2, Pixel Circuit Configuration

Figure 28:
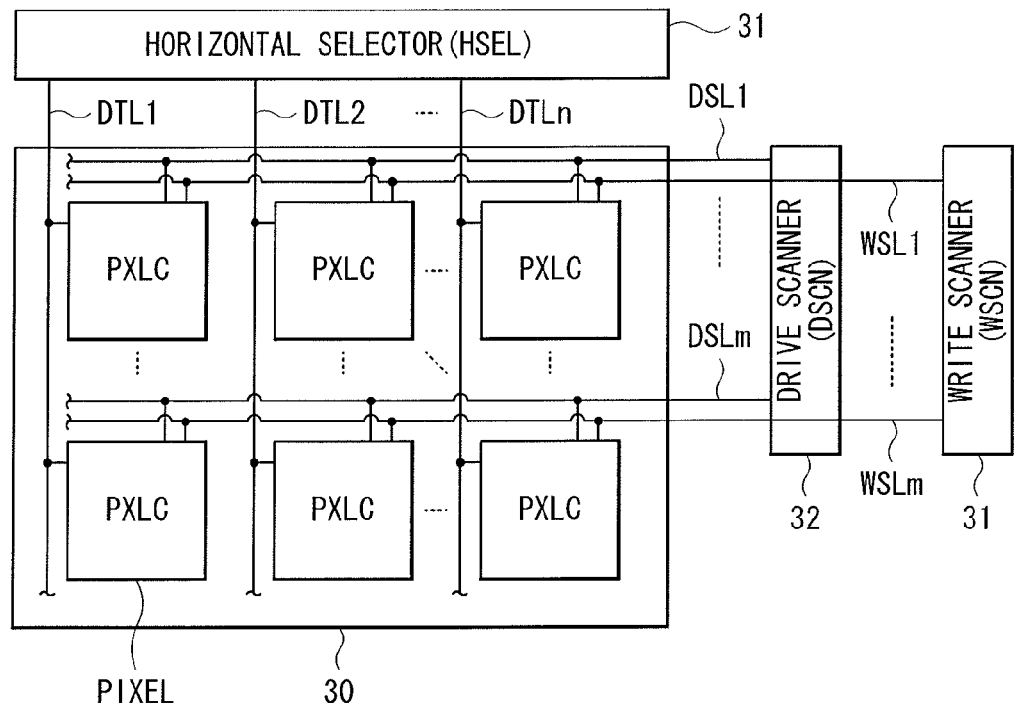
FIG. 28 is a diagram illustrating a whole configuration including a peripheral circuit of the display according to each of the embodiments.

Next, whole configurations of the displays 1 and 2 according to the first and second embodiments and a pixel circuit configuration will be described below. FIG. 28 illustrates a whole configuration including a peripheral circuit of a display used as an organic EL display. As illustrated in the drawing, for example, a display region 30 configured by arranging a plurality of pixels PXLC including organic EL elements in a matrix form is formed on the substrate 10, and a horizontal selector (HSEL) 31 as a signal drive circuit, a write scanner (WSCN) 32 as a scanning line drive circuit and a drive scanner (DSCN) 33 as a power supply line drive circuit are arranged around the display region 30.

In the display region 30, a plurality (an integer n) of signal lines DTL1 to DTLn are arranged in a column direction, and a plurality of (an integer m) of scanning lines WSL1 to WSLm and a plurality (an integer m) of power supply lines DSL1 to DSLm are arranged in a row direction. Moreover, one pixel PXLC (one of pixels corresponding to R, G and B) is arranged at each of intersections of the signal lines DTL and the scanning lines WSL. Each of the signal lines DTL is connected to the horizontal selector 31, and a picture signal is supplied from the horizontal selector 31 to each of the signal lines DTL. Each of the scanning lines WSL is connected to the write scanner 32, and a scanning signal (a selection pulse) is supplied from the write scanner 32 to each of the scanning lines WSL. Each of the power supply lines DSL is connected to the drive scanner 33, and a power supply signal (a control pulse) is supplied from the drive scanner 33 to each of the power supply lines DSL.

Figure 29:
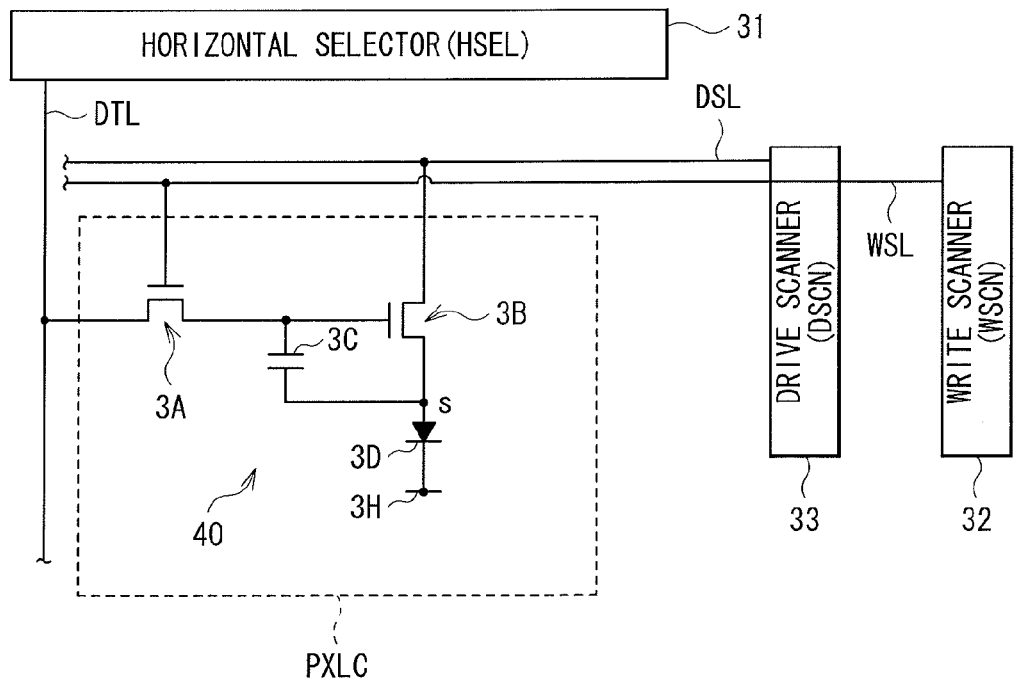
FIG. 29 is a diagram illustrating a circuit configuration of a pixel illustrated in FIG. 28.

FIG. 29 illustrates a specific circuit configuration example of the pixel PXLC. Each pixel PXLC includes a pixel circuit 40 including an organic EL element 3D. The pixel circuit 40 is an active type drive circuit including a sampling transistor 3A and a drive transistor 3B, a retention capacitive element 3C and the organic EL element 3D. Among them, the organic EL element 3D corresponds to the organic EL element 1a or 2b in the above-described embodiments and the like, and the transistor 3A (or the transistor 3B) corresponds to the TFT 1b or 2b in the above-described embodiments and the like.

A gate of the sampling transistor 3A is connected to a scanning line WSL corresponding thereto, and one of a source and a drain of the sampling transistor 3A is connected to a signal line DTL corresponding thereto, and the other is connected to a gate of the drive transistor 3B. A drain of the drive transistor 3B is connected to a power supply line DSL corresponding thereto, and a source of the drive transistor 3B is connected to an anode of the organic EL element 3D. Moreover, a cathode of the organic EL element 3D is connected to ground wiring 3H. In addition, the ground wiring 3H is commonly connected to all pixels PXLC. The retention capacitive element 3C is arranged between the source and the gate of the drive transistor 3B.

The sampling transistor 3A conducts in response to a scanning signal (a selection pulse) supplied from the scanning line WSL so as to sample a signal potential of a picture signal supplied from the signalling DTL and retain the signal potential in the retention capacitive element 3C. The drive transistor 3B receives the supply of a current from the power supply line DSL set to a predetermined first potential (not illustrated) to supply a drive current to the organic EL element 3D in response to the signal potential retained in the retention capacitive element 3C. The organic EL element 3D emits light with luminance according to the signal potential of the picture signal in response to the drive current supplied from the drive transistor 3B.

In such a circuit configuration, the sampling transistor 3A conducts in response to the scanning signal (the selection pulse) supplied from the scanning line WSL, thereby the signal potential of the picture signal supplied from the signal line DTL is sampled to be retained in the retention capacitive element 3C. Moreover, a current is supplied from the power supply line DSL set to the above-described first potential to the drive transistor 3B, and a drive current is supplied to the organic EL element (each of organic EL elements of red, green and blue) in response to the signal potential retained in the retention capacitive element 3C. Then, each organic EL element 3D emits light with luminance according to the signal potential of the picture signal in response to the supplied drive current. Thereby, a picture based on the picture signal is displayed on the display.

APPLICATION EXAMPLES

Application examples of the above-described displays 1 and 2 to electronic devices will be described below. The displays 1 and 2 are applicable to electronic devices in any fields, such as televisions, digital cameras, notebook personal computers, portable terminal devices such as cellular phones, and video cameras. In other words, the displays 1 and 2 are applicable to electronic devices in any fields displaying a picture signal inputted from outside or a picture signal produced inside as an image or a picture.

Module

Figure 30:
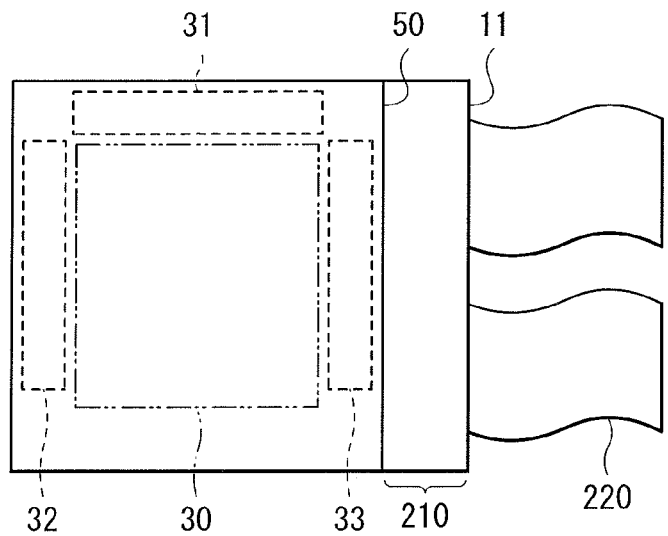
FIG. 30 is a plan view illustrating a schematic configuration of a module including the display illustrated in FIG. 28.

The above-described displays are incorporated into various electronic devices such as Application Examples 1 to 5 which will be described later as a module as illustrated in, for example, FIG. 30. In the module, for example, a region 210 exposed from a sealing substrate 50 is arranged on a side of the substrate 10, and an external connection terminal (not illustrated) is formed in the exposed region 210 by extending wiring of the horizontal selector 31, the write scanner 32 and the drive scanner 33. In the external connection terminal, a flexible printed circuit (FPC) 220 for signal input/output may be arranged.

Application Example 1

Figure 31:
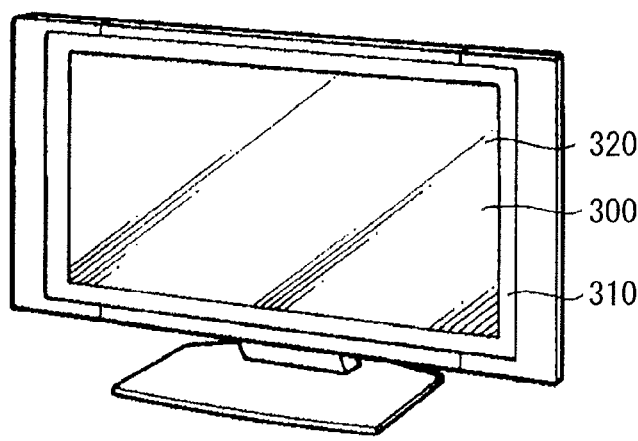
FIG. 31 is an external perspective view of Application Example 1 of the display illustrated in FIG. 28.

FIG. 31 illustrates an appearance of a television. The television has, for example, a picture display screen section 300 including a front panel 310 and a filter glass 320. The picture display screen section 300 corresponds to the display 1 or 2.

Application Example 2

Figure 32A:
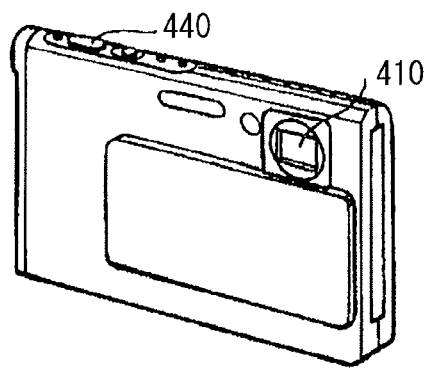
FIGS. 32A and 32B are an external perspective view from the front side of Application Example 2 and an external perspective view from the back side of Application Example 2, respectively.
Figure 32B:
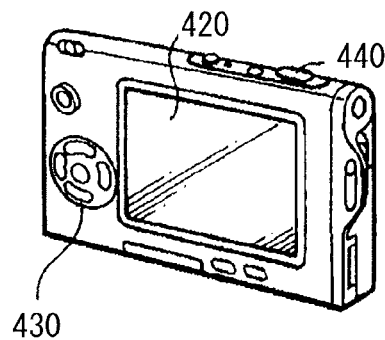

FIGS. 32A and 32B illustrate appearances of a digital camera. The digital camera has, for example, a light-emitting section for a flash 410, a display section 420, a menu switch 430, and a shutter button 440. The display section 420 corresponds to the display 1 or 2.

Application Example 3

Figure 33:
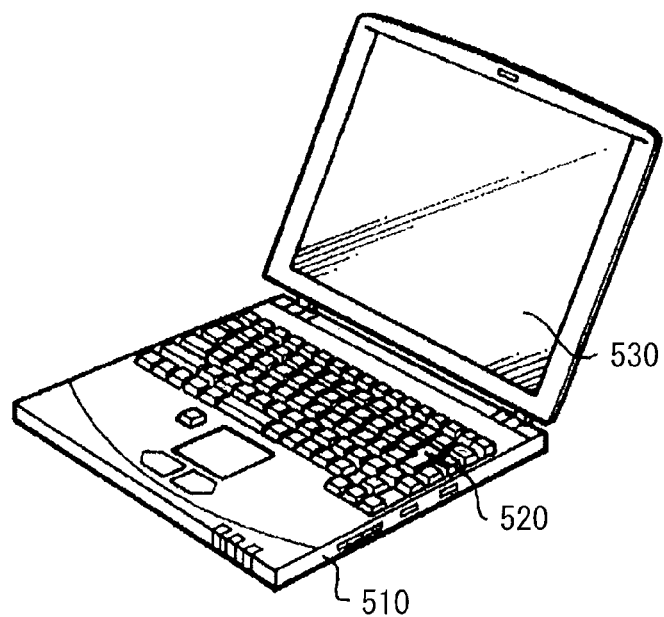
FIG. 33 is an external perspective view of Application Example 3.

FIG. 33 illustrates an appearance of a notebook personal computer. The notebook personal computer has, for example, a main body 510, a keyboard 520 for operation of inputting characters and the like, and a display section 530 for displaying an image. The display section 530 corresponds to the display 1 or 2.

Application Example 4

Figure 34:
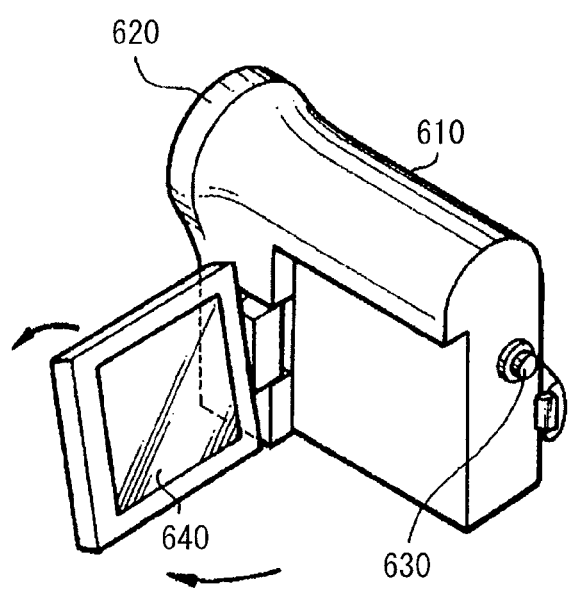
FIG. 34 is an external perspective view of Application Example 4.

FIG. 34 illustrates an appearance of a video camera. The video camera has, for example, a main body 610, a lens for shooting an object 620 arranged on a front surface of the main body 610, a shooting start/stop switch 630, and a display section 640. The display section 640 corresponds to the display 1 or 2.

Application Example 5

FIGS. 35A to 35G illustrate appearances of a cellular phone. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 corresponds to the display 1 or 2.

Although the present application is described referring to the embodiments, the application is not limited thereto, and may be variously modified. For example, in the above-described embodiments, a three-layer configuration in which top and bottom surfaces of an electrode layer are covered with metal thin films is described as an example of the source-drain electrode layer, but the configuration of the source-drain electrode layer is not limited thereto, and the source-drain electrode layer may have a two-layer configuration in which an upper metal film is formed on a top surface of the electrode layer. However, to secure contact with a layer below the electrode layer and prevent corrosion during a process, it is desirable to have a laminate film configuration including three or more layers described in the above-described embodiments. Alternatively, a multilayer film configuration in which four or more layers are laminated may be used. Moreover, the case where the gate electrode layer has a two-layer configuration including an electrode layer and an upper metal layer is described as an example, but the configuration of the gate electrode layer is not limited thereto, and the gate electrode layer may have a multilayer film configuration including three or more layers.

Moreover, in the above-described embodiments, the case where after the protective film 16 is formed, a part corresponding to the region 10A of the protective film 16 is removed, and then the inter-pixel insulating film is formed is described as an example, but the patterning procedure of the protective film 16 is not limited thereto. For example, after the protective film 16 is formed on the whole surface of the substrate 10, the inter-pixel insulating film may be formed, and after an opening is formed in the inter-pixel insulating film, a part corresponding to the region 10A of the protective film 16 may be removed. Also in this case, the protective film 16 is selectively removed by etching with use of the inter-pixel insulating film as a mask.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A light-emitting element comprising:
 a gate electrode layer including a gate electrode metal base layer and a gate electrode upper metal layer, the gate electrode upper metal layer having an opening formed therein, the gate electrode layer including a first gate electrode portion that is provided in a light-emitting element area, and a second gate electrode portion coplanar with the first portion and provided in a transistor area;
 an organic layer including a light-emitting layer, the opening in the gate electrode upper metal layer provided in a location corresponding to a light-emitting area of the light-emitting layer, and a bottom surface of the organic layer provided in direct contact with an upper surface of the gate electrode metal base layer, and a sidewall surface of the organic layer is provided in direct contact with a sidewall surface of the gate electrode upper material layer via said opening in this location;
 an upper electrode disposed on the organic layer; and
 a source-drain electrode layer provided in the transistor area and including a lower electrode material layer and an upper metal layer disposed on the lower electrode material layer;
 wherein the lower electrode material layer of the source-drain electrode layer is provided in direct contact with the gate electrode upper metal layer, and
 wherein an insulating layer is provided in a lateral direction between the source-drain electrode layer and the organic layer such that the sidewall surface of the organic layer is separated from a sidewall surface of the source-drain electrode layer.

2. The light-emitting element of claim 1, wherein the lower electrode material layer includes a light reflection metal selected from the group consisting of aluminum, aluminum alloy, silver, and silver alloy, and wherein the upper metal layer includes an opaque metal selected from the group consisting of molybdenum and titanium.

3. A display comprising:
 a light-emitting element and a transistor arranged on a substrate, the light-emitting element including
 a gate electrode layer including a gate electrode metal base layer and a gate electrode upper metal layer, the gate electrode upper metal layer having an opening formed therein, the gate electrode layer including a first gate electrode portion that is provided in a light-emitting element area, and a second gate electrode portion coplanar with the first portion and provided in a transistor area,
 an organic layer including a light-emitting layer, the opening in the gate electrode upper metal layer provided in a location corresponding to a light-emitting area of the light-emitting layer, and a bottom surface of the organic layer provided in direct contact with an upper surface of the gate electrode metal base layer, and a sidewall surface of the organic layer is provided in direct contact with a sidewall surface of the gate electrode upper material layer via said opening in this location,
 an upper electrode disposed on the organic layer, and
 a source-drain electrode layer provided in the transistor area and including a lower electrode material layer and an upper metal layer disposed on the lower electrode material layer,
 wherein the lower electrode material layer of the source-drain electrode layer is provided in direct contact with the gate electrode upper metal layer, and
 wherein an insulating layer is provided in a lateral direction between the source-drain electrode layer and the organic layer such that the sidewall surface of the organic layer is separated from a sidewall surface of the source-drain electrode layer.

4. The display of claim 3, wherein the lower electrode material layer includes a light reflection metal selected from the group consisting of aluminum, aluminum alloy, silver, and silver alloy, and wherein the upper metal layer includes an opaque metal selected from the group consisting of molybdenum and titanium.

5. A display element comprising:
 a light-emitting element arranged on a substrate, the light-emitting element including
 a gate electrode layer including a gate electrode metal base layer and a gate electrode upper metal layer, the gate electrode upper metal layer having an opening formed therein, the gate electrode layer including a first gate electrode portion that is provided in a light-emitting element area, and a second gate electrode portion coplanar with the first portion and provided in a drive element area,
 an organic layer including a light-emitting layer, the opening in the gate electrode upper metal layer provided in a location corresponding to a light-emitting area of the light-emitting layer, and a bottom surface of the organic layer provided in direct contact with an upper surface of the gate electrode metal base layer, and a sidewall surface of the organic layer is provided in direct contact with a sidewall surface of the gate electrode upper material layer via said opening in this location,
 an upper electrode disposed on the organic layer, and
 a source-drain electrode layer provided in the drive element area and including a lower electrode material layer and an upper metal layer disposed on the lower electrode material layer; and
 a drive element arranged on the substrate in the drive element area and including the gate electrode layer and the source-drain electrode layer, wherein the lower electrode material layer of the source-drain electrode layer is provided in direct contact with the gate electrode upper metal layer, and wherein an insulating layer is provided in a lateral direction between the source-drain electrode layer and the organic layer such that the sidewall surface of the organic layer is separated from a sidewall surface of the source-drain electrode layer.

6. The display element of claim 4, wherein the lower electrode material layer includes a light reflection metal selected from the group consisting of aluminum, aluminum alloy, silver, and silver alloy, and wherein the upper metal layer includes an opaque metal selected from the group consisting of molybdenum and titanium.

7. The display element of claim 5, wherein the drive element includes a bottom gate configuration.

8. The display element of claim 5, wherein the drive element includes a top gate configuration.

9. A display comprising a display element, the display element including:
- a light-emitting element arranged on a substrate, the light-emitting elements including
  - a gate electrode layer including a gate electrode metal base layer and a gate electrode upper metal layer, the gate electrode upper metal layer having an opening formed therein, the gate electrode layer including a first gate electrode portion that is provided in a light-emitting element area, and a second gate electrode portion coplanar with the first portion and provided in a drive element area,
  - an organic layer including a light-emitting layer, the opening in the gate electrode upper metal layer provided in a location corresponding to a light-emitting area of the light-emitting layer, and a bottom surface of the organic layer provided in direct contact with an upper surface of the gate electrode metal base layer, and a sidewall surface of the organic layer is provided in direct contact with a sidewall surface of the gate electrode upper material layer via said opening in this location,
  - an upper electrode disposed on the organic layer, and
- a source-drain electrode layer provided in the drive element area and including a lower electrode material layer and an upper metal layer disposed on the lower electrode material layer; and
- a drive element arranged on the substrate in the drive element area and including the gate electrode layer and the source-drain electrode layer, wherein the lower electrode material layer of the source-drain electrode layer is provided in direct contact with the gate electrode upper metal layer, and wherein an insulating layer is provided in a lateral direction between the source-drain electrode layer and the organic layer such that the sidewall surface of the organic layer is separated from a sidewall surface of the source-drain electrode layer.

10. The display of claim 9, wherein the lower electrode material layer includes a light reflection metal selected from the group consisting of aluminum, aluminum alloy, silver, and silver alloy, and wherein the upper metal layer includes an opaque metal selected from the group consisting of molybdenum and titanium.

11. The display of claim 9, wherein the drive element includes a bottom gate configuration.

12. The display of claim 9, wherein the drive element includes a top gate configuration.

13. An electronic device comprising a display according to claim 3.

14. An electronic device comprising a display according to claim 9.

* * * * *